(12) United States Patent
Wu et al.

(10) Patent No.: US 10,157,960 B2
(45) Date of Patent: Dec. 18, 2018

(54) LIGHT-EMITTING DEVICE WITH ELECTRODE EXTENDING LAYER

(71) Applicant: Episky Corporation (Xiamem) Ltd, Xiamen (CN)

(72) Inventors: Che-Shiung Wu, Xiamen (CN); Chan-Yang Lu, Xiamen (CN); Jian-Ke Liu, Xiamen (CN); Mei-Ying Bai, Xiamen (CN); Cong-Hui Lin, Xiamen (CN); Xiao-Qiang Zeng, Xiamen (CN)

(73) Assignee: EPISKY CORPORATION (XIAMEM) LTD, Xiamen (CN)

( * ) Notice: Subject to any disclaimer, the term of this patent is extended or adjusted under 35 U.S.C. 154(b) by 0 days.

(21) Appl. No.: 14/970,519

(22) Filed: Dec. 15, 2015

(65) Prior Publication Data

US 2016/0172342 A1 Jun. 16, 2016

(30) Foreign Application Priority Data

Dec. 16, 2014 (CN) .......................... 2014 1 0774774
Jun. 15, 2015 (CN) .......................... 2015 1 0328720

(51) Int. Cl.
*H01L 27/15* (2006.01)
*H01L 33/38* (2010.01)
*H01L 33/44* (2010.01)

(52) U.S. Cl.
CPC .......... *H01L 27/156* (2013.01); *H01L 33/382* (2013.01); *H01L 33/44* (2013.01); *H01L 33/387* (2013.01); *H01L 2224/24225* (2013.01); *H01L 2924/0002* (2013.01)

(58) Field of Classification Search
CPC .... H01L 33/38–33/387; H01L 27/153–27/156
See application file for complete search history.

(56) References Cited

U.S. PATENT DOCUMENTS

| | | | | |
|---|---|---|---|---|
| 2011/0266579 A1* | 11/2011 | Nagai | .................. | H01L 27/156 257/98 |
| 2013/0234192 A1* | 9/2013 | Kim | ....................... | H01L 33/38 257/98 |
| 2014/0159091 A1* | 6/2014 | Hon | ........................ | H01L 33/44 257/98 |

(Continued)

*Primary Examiner* — Stephen Bradley
(74) *Attorney, Agent, or Firm* — Chung-Ming Shih

(57) ABSTRACT

A light-emitting device includes a substrate; a light-emitting unit formed on the substrate, comprising a first conductivity type semiconductor; a second conductivity type semiconductor; an active layer formed between the first and the second conductivity type semiconductors; and an exposed region formed in the light-emitting unit, exposing the first conductivity type semiconductor; a first electrode extending layer formed on the first conductivity type semiconductor in the exposed region; a second electrode extending layer formed on the second conductivity type semiconductor; a transparent insulator, formed on the light-emitting unit and filled in the exposed region; a first electrode formed on the transparent insulator; and a plurality of conductive channel layers formed in the transparent insulator; wherein one of the plurality of conductive channel layers connects the first electrode and one of the first and the second electrode extending layers.

11 Claims, 21 Drawing Sheets

(56) References Cited

U.S. PATENT DOCUMENTS

2014/0291714 A1* 10/2014 Jeon ................ H01L 33/46
 257/98
2016/0126413 A1* 5/2016 Kim ................ H01L 33/06
 257/13

* cited by examiner

LIGHT-EMITTING DEVICE WITH ELECTRODE EXTENDING LAYER

CROSS-REFERENCE TO RELATED APPLICATIONS

This application claims the benefit of China patent application No. 201410774774.X filed on Dec. 16, 2014 and China patent application No. 201510328720.5 filed on Jun. 15, 2015, and the content of which are incorporated by reference in its entirety.

BACKGROUND

Technical Field

The present disclosure relates to a light-emitting device, more particularly, to a light-emitting device with improved brightness.

Description of the Related Art

The light-emitting diodes (LEDs) have the characteristics of low power consumption and long lifetime, so the LEDs have been widely used in various appliances. Recently, since the LEDs have great progress in light efficiency, the LEDs have developed quickly and been used in lighting applications.

Normally, a conventional gallium nitride (GaN) based LED is grown on a sapphire substrate. In the process of electroding, especially forming n-electrodes, a part of a p-type semiconductor and an active layer have to be etched. Then, an n-electrode is formed on and connects to an n-type semiconductor. Such a LED structure may have a problem that the p-electrode and the n-electrode are not formed at the same level and do not have coplanar ends, so that it is a disadvantage to flip-chip mounting or surface mounting. Besides, the arrangements of the p-electrode and the n-electrode are inflexible so that it is unfavorable for various designs of the LED structure. More light-emitting area is etched away when forming the n-electrode. Thus, more light-emitting area is lost and thereby the light-emitting efficiency is degraded.

FIG. 1 shows a conventional LED device which is composed of a plurality of the LED units 28 with the structure described above electrically connected in an array. The plurality of the LED units 28 is formed on a substrate 100, and a plurality of electrical connecting layers 300 electrically connects the LED units 28. An insulator 140 is disposed under the electrical connecting layer 300 and between any two adjacent LED units 28. The start and the end LED units respectively comprise a second electrode 302 and a first electrode 301. The LED device has disadvantages as following: first one is the scheme of such electrical connection limits the electrode layout so it may be difficult to realize a complex electrical connection; second one is because of the difference in heights between the insulator 140 and the LED units 28, the electrical connecting layer 300 may crack easily and reliability of the LED device is degraded; last one is current spreading in each LED unit are not uniform.

SUMMARY OF THE DISCLOSURE

A light-emitting device includes a substrate; a light-emitting unit formed on the substrate, comprising a first conductivity type semiconductor; a second conductivity type semiconductor; an active layer formed between the first and the second conductivity type semiconductors; and an exposed region formed in the light-emitting unit, exposing the first conductivity type semiconductor; a first electrode extending layer formed on the first conductivity type semiconductor in the exposed region; a second electrode extending layer formed on the second conductivity type semiconductor; a transparent insulator, formed on the light-emitting unit and filled in the exposed region; a first electrode formed on the transparent insulator; and a plurality of conductive channel layers formed in the transparent insulator; wherein one of the plurality of conductive channel layers connects the first electrode and one of the first and the second electrode extending layers.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
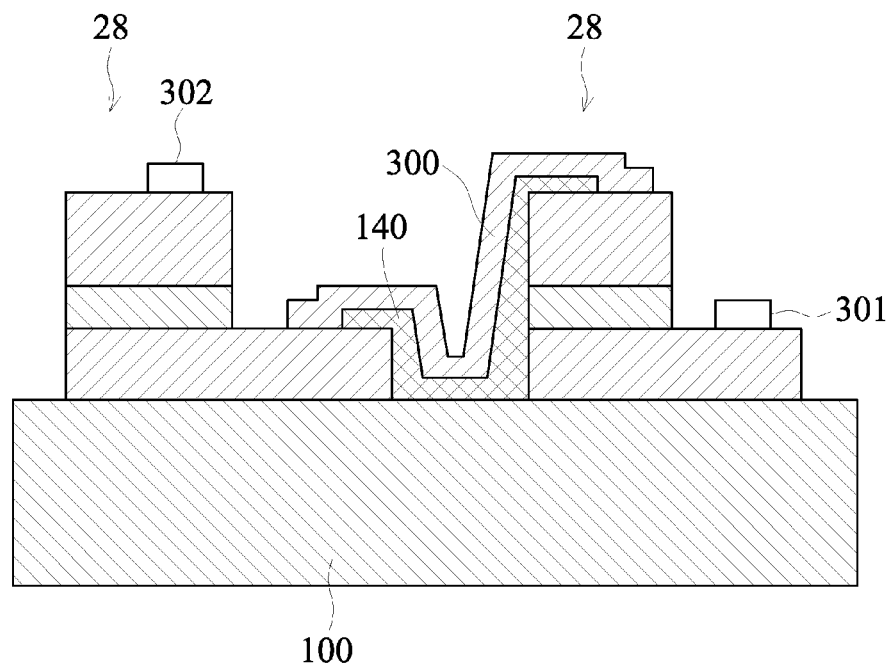
FIG. 1 is a conventional LED device.
Figure 2A:
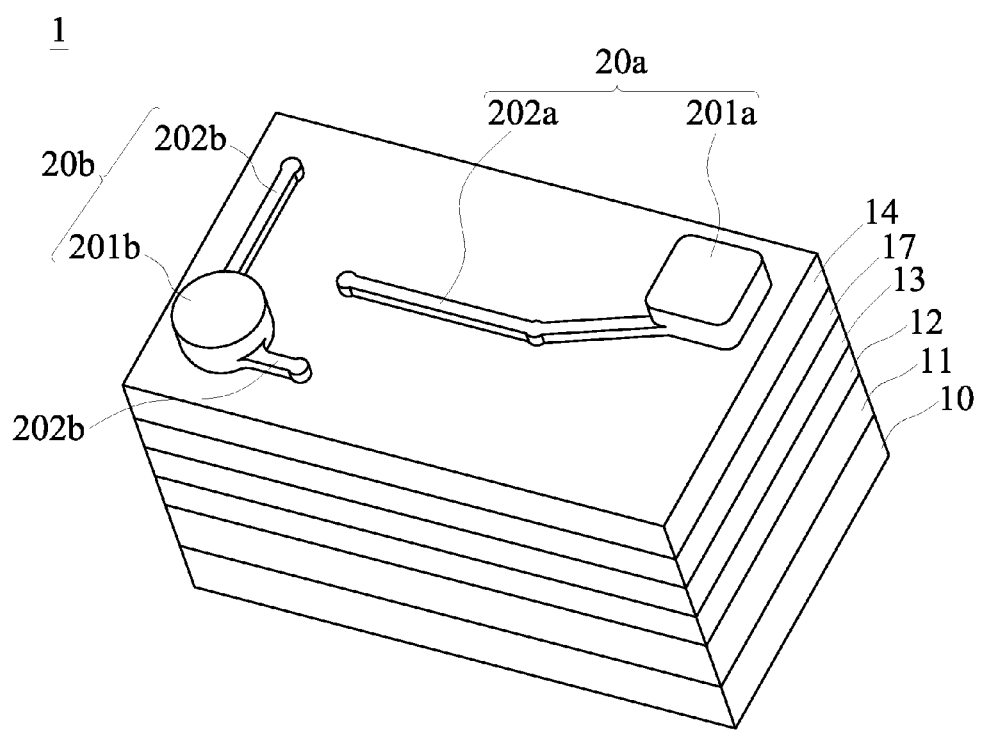
FIGS. 2A-2F show a light-emitting device 1 in accordance with a first embodiment of present disclosure.
Figure 2B:
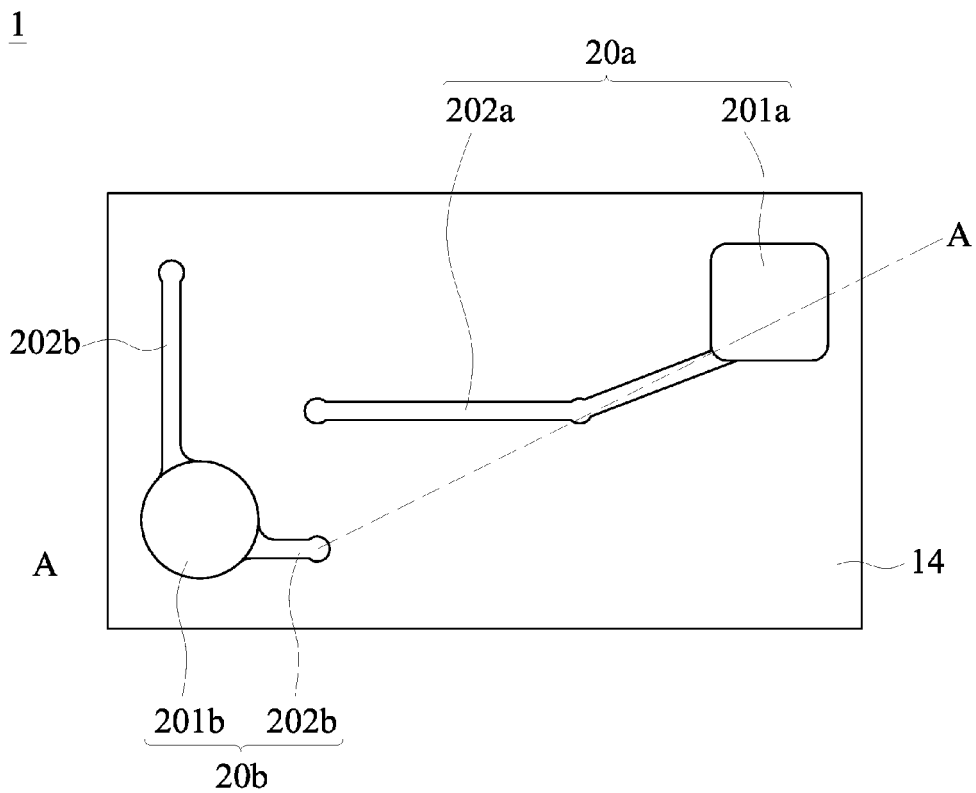
Figure 2C:
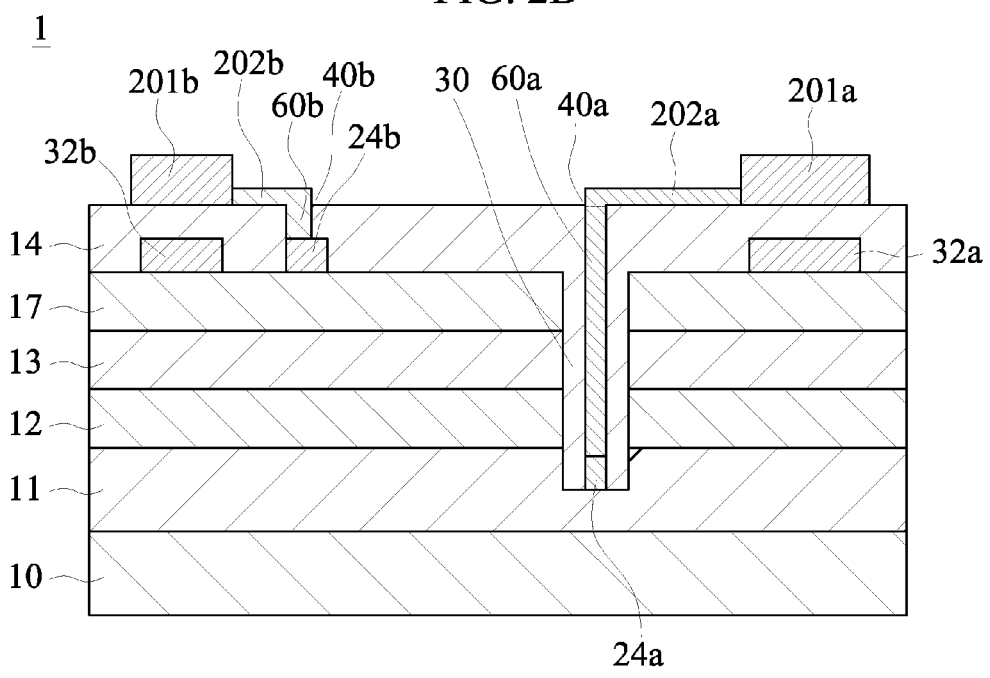

FIGS. 2A-2F show a light-emitting device 1 in accordance with the first embodiment of the present disclosure. FIG. 2A shows a perspective view of the light-emitting device 1, and FIG. 2B is a top view of FIG. 2A. The light-emitting device 1 comprises a substrate 10 and a semiconductor stack on the substrate 10 formed by epitaxy process. The semiconductor stack comprises a first conductivity type semiconductor 11, an active layer 12 and a second conductivity type semiconductor 13 sequentially stacked. The material of the substrate 10 can be sapphire, germanium, InP, $LiAlO_2$, ZnO, silicon, SiC, GaN, AN or GaAs. The material of the first conductivity type semiconductor 11, the active layer 12 and the second conductivity type semiconductor 13 includes compounds having one or more than one element selected form Al, Ga, In, N, P, As or Si. Ga, Al, In, P, N, Zn, Cd or S, such as AlInGaP, AlN, GaN, AlGaN, InGaN or AlInGaN. The structure of the active layer 12 can be single heterostructure (SH), double heterostructure (DH), double-side double heterostructure (DDH), multi-quantum well (MQW). The conductivities of the first conductivity type semiconductor 11 and the second conductivity type semiconductor 13 are different. In this embodiment, the first conductivity type semiconductor 11 can be an n-type semiconductor and the second conductivity type semiconductor 13 can be a p-type semiconductor. FIG. 2C shows a cross-sectional view along the A-A line in FIG. 2B. As shown in FIG. 2C, the semiconductor stack comprises an exposed region 30 therein. The exposed region 30 is formed by removing parts of the second conductivity type semiconductor 13, the active layer 12 and the first conductivity type semiconductor 11 and exposing a part of the first conductivity type semiconductor 11. In the embodiment the first conductivity type semiconductor and the second conductivity type semiconductor comprise different conductivity types, electricity, polarity, or dopant elements for providing electrons and holes.

A current spreading layer 17 is optionally formed on the second conductivity type semiconductor 13. The current spreading layer 17 is transparent to light emitted from the active layer 12 and can improve current conductivity and current spreading. The material of the current spreading layer 17 can be conductive material which includes but is not limited to ITO, InO, SnO, CTO, ATO, AZO, ZTO, GZO, ZnO, MgO, graphene or IZO. It also can be a semiconductor material which includes but is not limited to AlGaAs, GaN or GaP.

As shown in FIG. 2C, a first electrode extending layer 24a is formed on the first conductivity type semiconductor 11 in the exposed region 30. A second electrode extending layer 24b is formed on the second conductivity type semiconductor 13. In order to specifically show the structure of the light-emitting device 1 in the embodiment, FIG. 2E is a perspective view which hides a transparent insulator 14 of FIG. 2A. FIG. 2F is a top view of FIG. 2E. Referring to FIG. 2C and FIG. 2F, in this embodiment, the exposed regions 30 and the first electrode extending layers 24a are circles from the top view, and amounts of the exposed region 30 and the first electrode extending layer 24a are two. However, the amount of the exposed region 30 and the first electrode extending layer 24a can be optionally added. The second electrode extending layers 24b are striped shape from the top view and the amount of the second electrode extending layer 24b is two. Multiple second electrode extending layers 24b also can be arranged according to the purpose of current spreading. The layout of the second electrode extending layers 24b can also be a circle or a ring. The materials of the first and the second electrode extending layers 24a and 24b can be metal, such as Au, Ag, Cu, Cr, Al, Pt, Ni, Ti, Sn, the alloy thereof or combination of the stacks thereof.

As shown in FIG. 2C, the transparent insulator 14 connects to the second conductivity type semiconductor 13 and fills in the exposed region 30. The material of the transparent insulator 14 can be polyimide (PI), BCB, PFCB, MgO, SU8, Epoxy, Acrylic Resin, COC, PMMA, PET, PC, Polyetherimide, Fluorocarbon Polymer, glass, $Al_2O_3$, $SiO_x$, $TiO_2$, $Ta_2O_5$, $SiN_x$, spin-on-glass (SOG), TEOS, $MgF_2$ or combination thereof. The transparent insulator 14 can be a single layer or multi-layers made of the materials described above. A first electrode 20a and a second electrode 20b are formed on the transparent insulator 14 and used to electrically connect to an external power source and circuits. The first electrode 20a comprises a first pad 201a and a first extending part 202a extending from the first pad 201a. The second electrode 20b comprises a second pad 201b and a second extending part 202b extending from the second pad 201b.

Figure 2D:
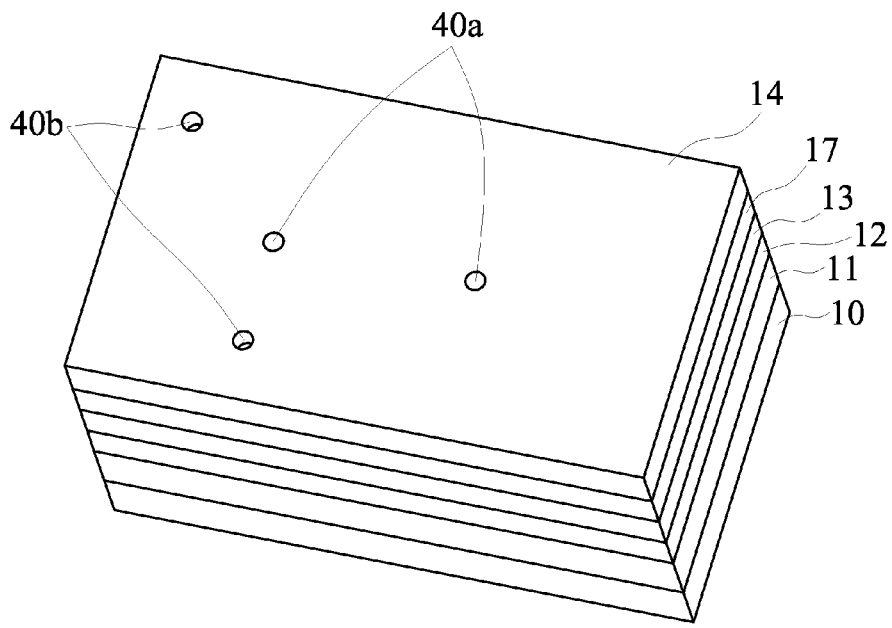
Figure 2E:
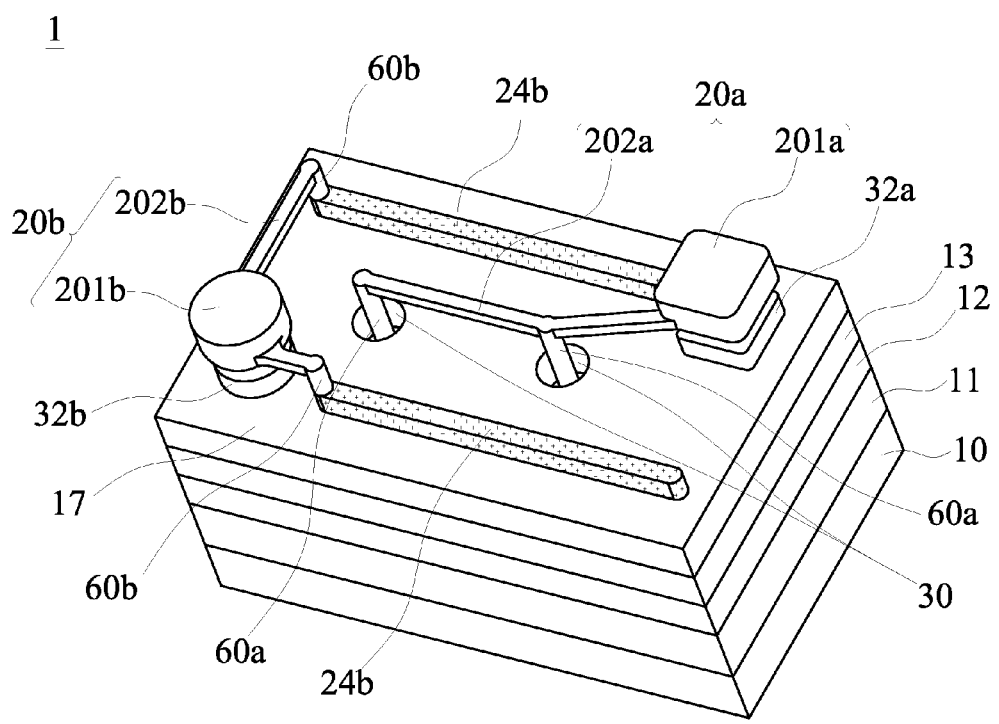
Figure 2F:
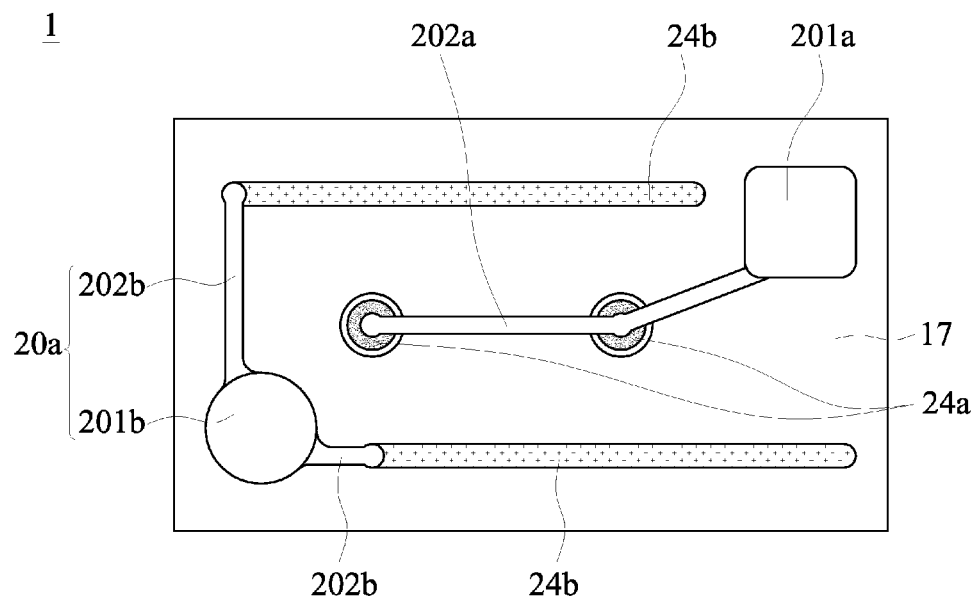

In order to specifically show the structure of the light-emitting device 1 in the embodiment, FIG. 2D is a perspective view which hides the first electrode 20a and the second electrode 20b of FIG. 2A. In FIG. 2D, the transparent insulator 14 comprises two first through holes 40a and two second through holes 40b. The first through holes 40a are formed in the transparent insulator 14 in the exposed region 30 and extend to the first electrode extending layer 24a. The second through holes 40b pass through the transparent insulator 14 and connect to the second electrode extending layer 24b. That is, the first and the second through holes 40a and 40b are defined by the transparent insulator 14 and are surrounded by the transparent insulator 14. A diameter of the first through holes 40a and/or the second through holes 40b is between 3 μm-20 μm. A thickness of the transparent insulator 14 can be larger than 1.2 μm so that light shaded by the first and/or the second electrodes 20a and 20b can be reduced and more light can be extracted to the outside accordingly. The first electrode 20a and the second electrode 20b substantially have the same heights or surfaces of the first electrode 20a and the second electrode 20b are coplanar, so it will benefit the flip-chip mounting or the surface-mounting of the light-emitting device.

Referring to FIG. 2C, a first conductive channel layer 60a is formed in the first through hole 40a. The first conductive channel layer 60a connects the first electrode extending layer 24a and the first electrode 20a. A second conductive channel layer 60b is formed in the second through hole 40b. The second conductive channel layer 60b connects the second electrode extending layer 24b and the second electrode 20b. In the embodiment, the first conductive channel layer 60a connects the first extending part 202a. The second conductive channel layer 60b connects the second extending part 202b. The amounts of the first through holes 40a and the corresponding first conductive channel layer 60a or the amounts of the second through holes 40b and the corresponding second conductive channel layer 60b are not limited to two. A better current spreading or current conductivity can be achieved by the arrangements of these multiple through holes and the conductive channel layers.

Figure 3:
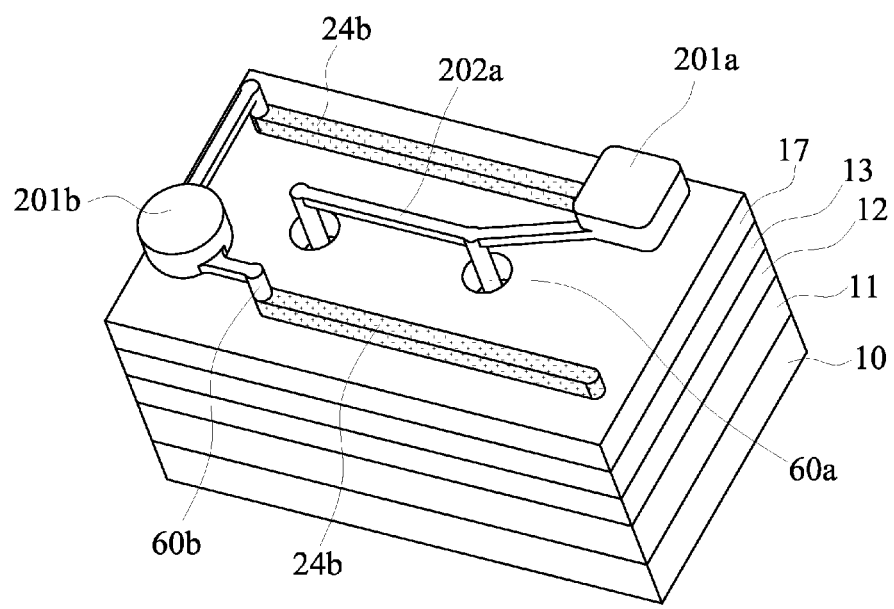
FIG. 3 shows a light-emitting device 1 in accordance with another embodiment of present disclosure.

A reflector 32a is formed in the transparent insulator 14 under the first electrode 20a. The reflector 32a has a same shape as the first pad 201a, and the area of the reflector 32a is not greater than that of the first pad 201a. The reflector 32a connects the current spreading layer 17. In another embodiment, a part of the current spreading layer 17 under the first pad 201a can be removed, and then the reflector 32a is formed on and connects the second conductivity type semiconductor 13. Similarly, another reflector 32b is formed in the transparent insulator 14 under the second pad 201b. The reflector 32b has a same shape as the second pad 201b, and the area of the reflector 32b is not greater than the second pad 201b. The reflector 32b connects the current spreading layer 17. In another embodiment, a part of the current spreading layer 17 under the second pad 201b can be removed, and then the reflector 32b is formed on and connects the second conductivity type semiconductor 13. In this manner, total reflection caused by the difference in refraction indexes between the second conductivity type semiconductor 13 and the current spreading layer 17 can be prevented, so that more light can be extracted to the outside. In another embodiment as shown in FIG. 3, the difference between the structure of this embodiment and that of the first embodiment is the first and the second pads 201a and 201b are disposed without reflectors thereunder. FIG. 3 is a perspective view which hides the transparent insulator 14 of FIG. 2A.

Figure 4A:
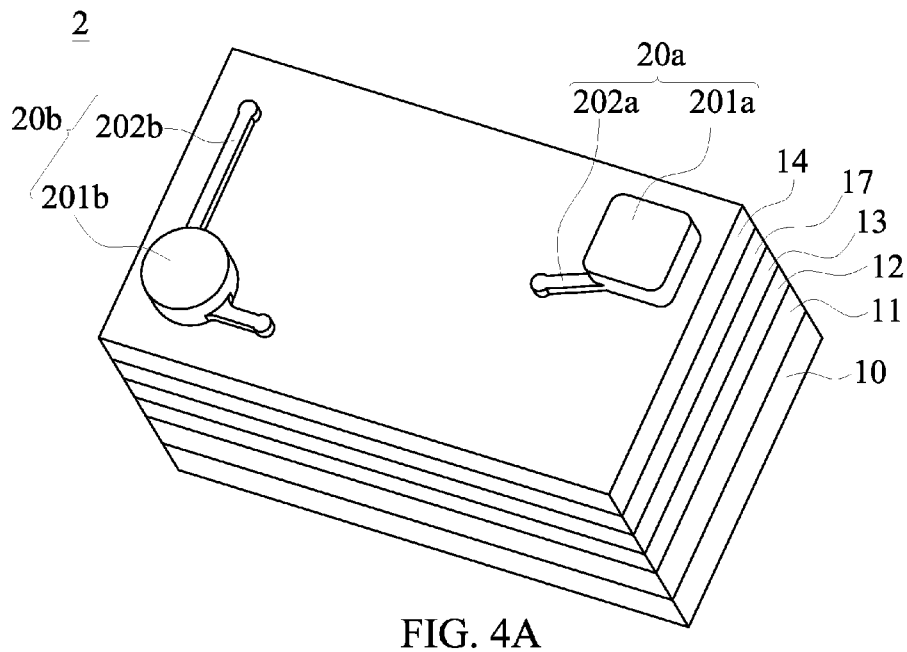
FIGS. 4A-4C show a light-emitting device 2 in accordance with a second embodiment of present disclosure.
Figure 4B:
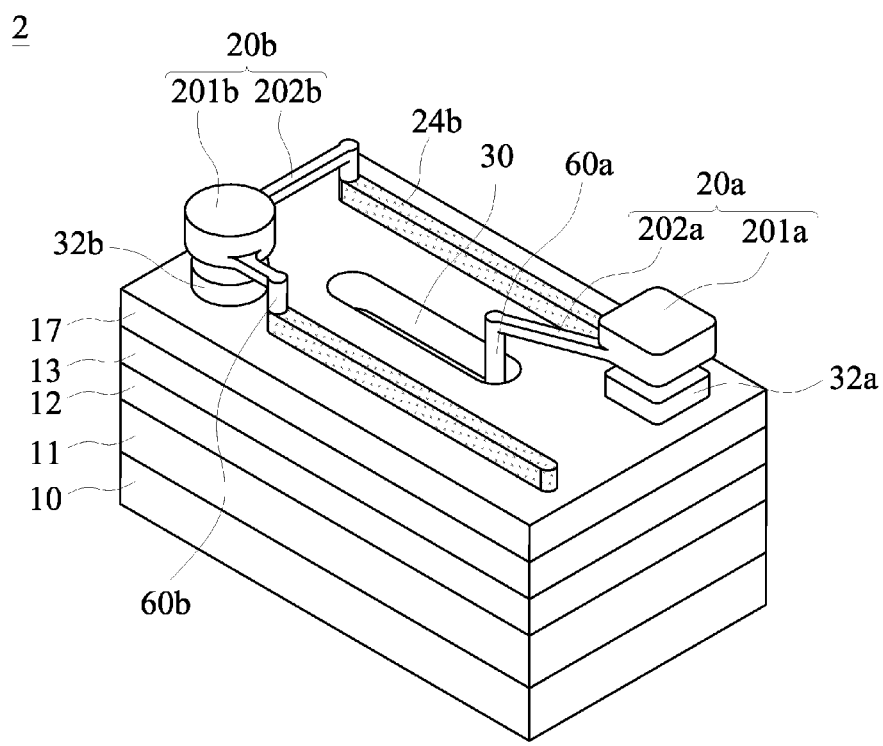
Figure 4C:
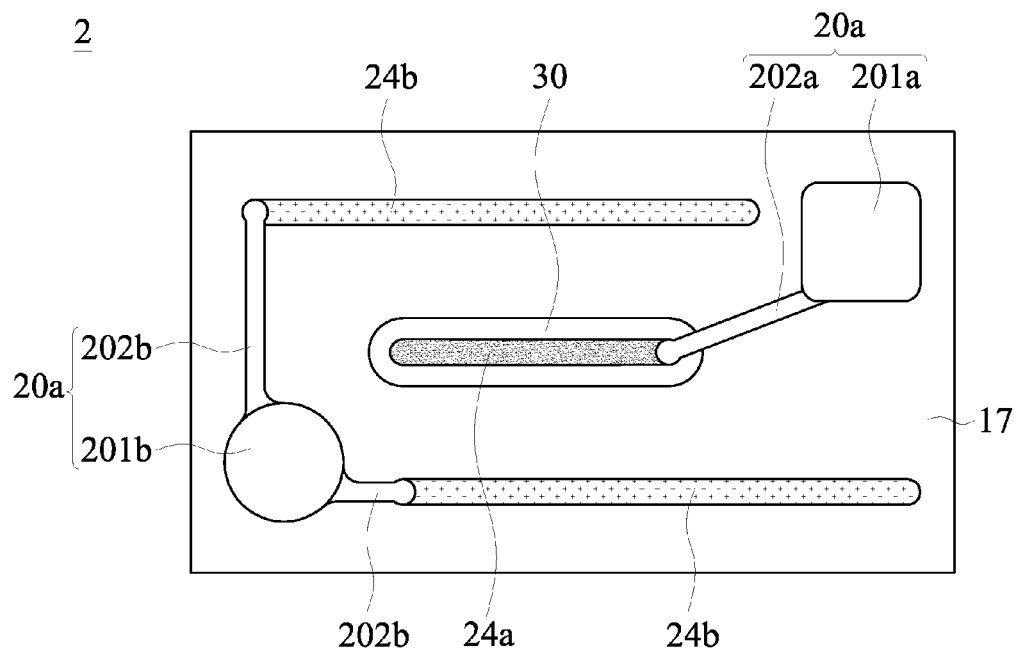

FIGS. 4A-4C show a light-emitting device 2 in accordance with the second embodiment of the present disclosure. In order to specifically show the structure of the light-emitting device 2 in this embodiment, FIG. 4B is a perspective view which hides the transparent insulator 14 of FIG. 4A. FIG. 4C is a top view of FIG. 4B. The difference between the structure of this embodiment and that of the first embodiment is the arrangement of the electrode extending layers and the through holes. As shown in FIGS. 4B and 4C, the exposed region 30 has a stripe shape from a top view. The first electrode extending layer 24a on the first conductivity type semiconductor 11 in the exposed region 30 has also a stripe shape from a top view. The first electrode extending layer 24a electrically connects to the first extending part 202a via the first conductive channel layer 60a in the first through hole 40a. The first electrode extending layer 24a and the second electrode extending layers 24b are alternately arranged from a top view. Therefore, the current spreading is enhanced and the light-emitting efficiency is improved due to the enhancement of the current spreading.

Figure 5:
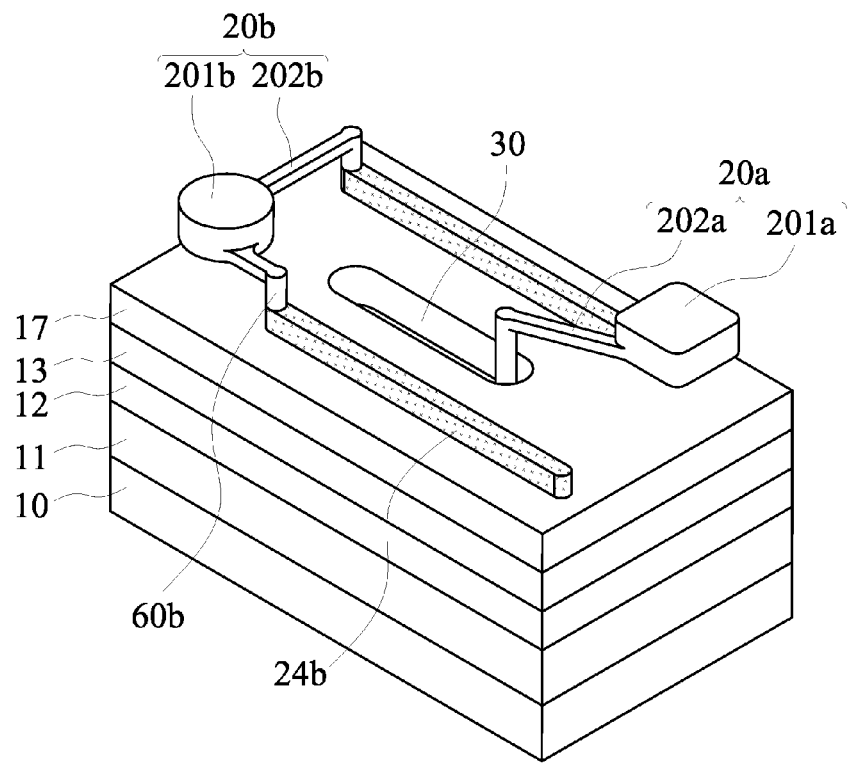
FIG. 5 shows a light-emitting device 2 in accordance with another embodiment of present disclosure.

In a similar way, as shown in FIG. 4B, a reflector 32a can be formed in the transparent insulator 14 under the first pad 201a. The reflector 32a has a same shape as the first pad 201a, and the area of the reflector 32a is not greater than that of the first pad 201a. The reflector 32a connects the current spreading layer 17. In another embodiment, a part of the current spreading layer 17 under the first pad 201a can be removed, and then the reflector 32a is formed on and connects the second conductivity type semiconductor 13. A reflector 32b is formed in the transparent insulator 14 under the second pad 201b. The reflector 32b has a same shape as the second pad 201b, and the area of the reflector 32b is not greater than the second pad 201b. The reflector 32b connects the current spreading layer 17. In another embodiment, a part of the current spreading layer 17 under the second pad 201b is removed, and then the reflector 32b is formed on and connects the second conductivity type semiconductor 13. In another embodiment shown in FIG. 5, the difference between the structure of this embodiment and that of the second embodiment is the reflectors are not formed.

Figure 6A:
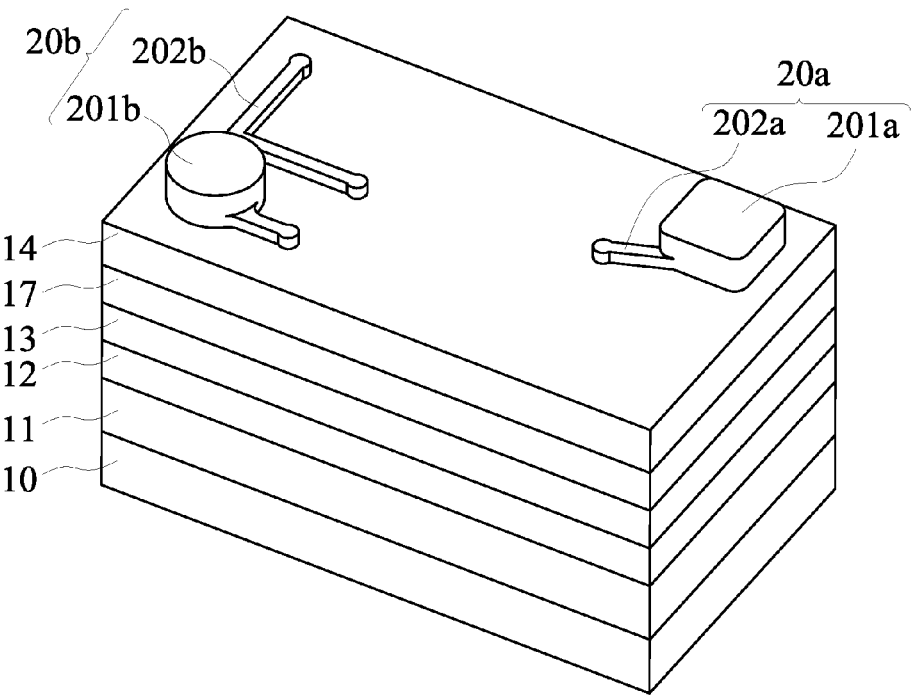
FIGS. 6A-6C show a light-emitting device 3 in accordance with a third embodiment of present disclosure.
Figure 6B:
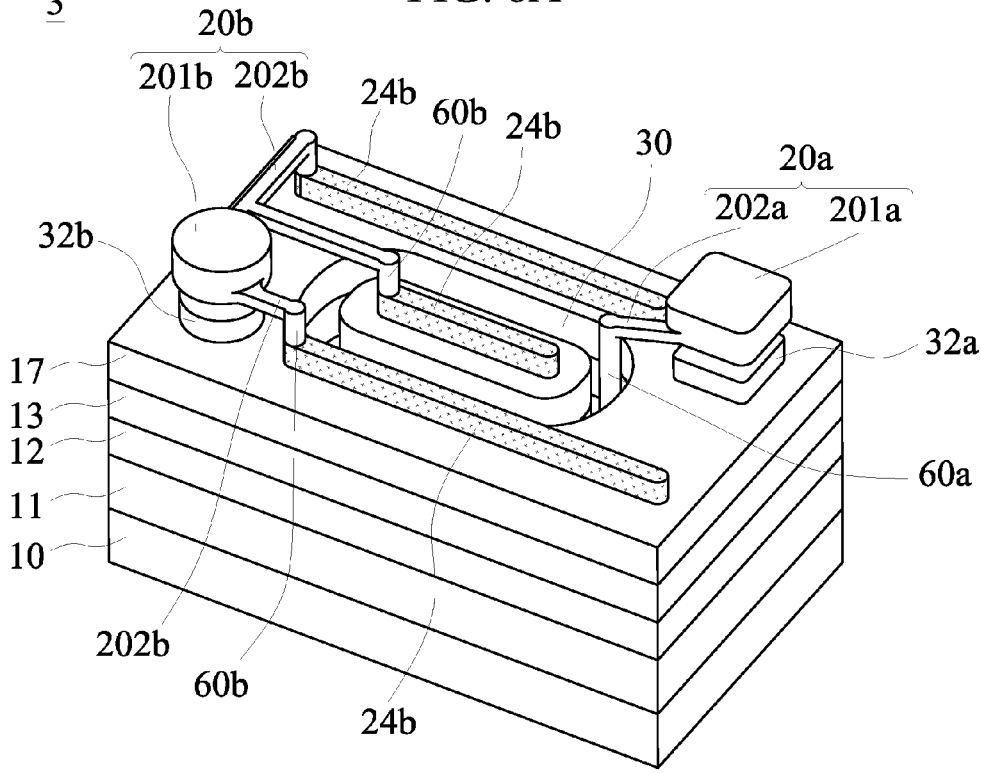
Figure 6C:
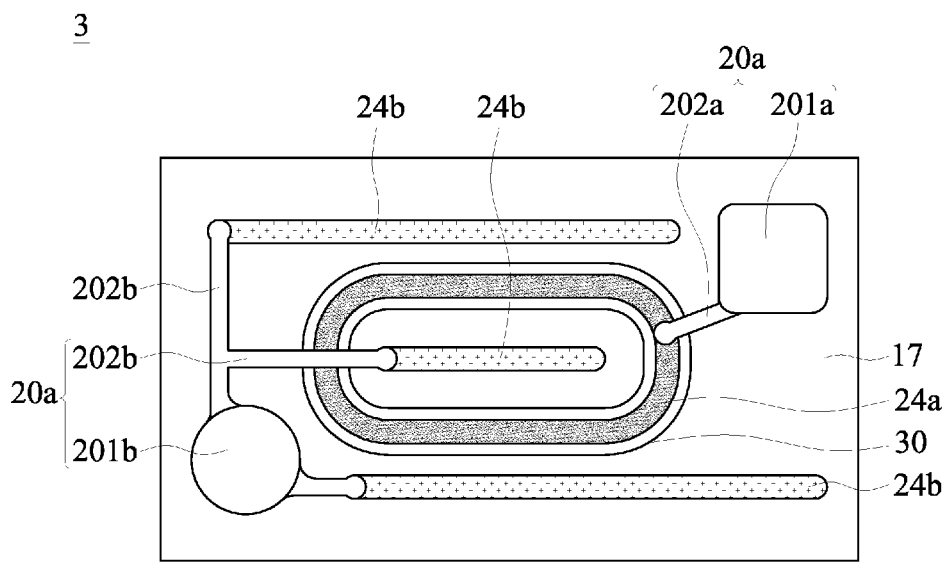

FIGS. 6A-6CD show a light-emitting device 3 in accordance with the third embodiment of the present disclosure. In order to specifically show the structure of the light-emitting device 3 in this embodiment, FIG. 6B is a perspective view which hides the transparent insulator 14 of FIG. 6A. FIG. 6C is a top view of FIG. 6B. The difference between the structure of this embodiment and that of the aforementioned embodiments is that, the exposed region 30 has a ring shape from a top view. The first electrode extending layer 24a has also a ring shape from a top view. The first electrode extending layer 24a electrically connects to the first electrode 20a by the first conductivity channel layer 60a in the first through hole 40a. A plurality of the second electrode extending layers 24b is formed on the second conductivity type semiconductor 13, and electrically connects to a plurality of the second extending parts 202b formed thereon by the second conductivity channel layers 60b in second through holes 40b. The first electrode extending layer 24a surrounds one of the second electrode extending layers 24b from a top view. In a similar way, in another embodiment, the two outmost second electrode extending layers 24b can be arranged to extend and connect to each other along the edge of the light-emitting device 3. As a result, the second electrode extending layer 24b surrounds the first electrode extending layers 24a from a top view.

Figure 7:
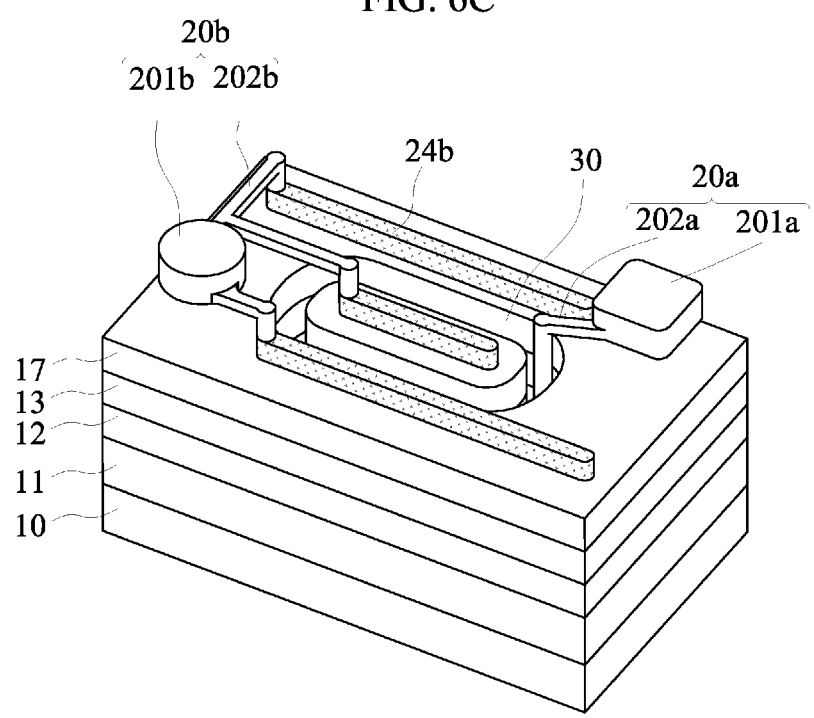
FIG. 7 shows a light-emitting device 3 in accordance with another embodiment of present disclosure.

As shown in FIG. 6B, a reflector 32a can be formed in the transparent insulator 14 under the first pad 201a. The reflector 32a has a same shape as the first pad 201a, and the area of the reflector 32a is not greater than that of the first pad 201a. The reflector 32a connects the current spreading layer 17. In another embodiment, a part of the current spreading layer 17 under the first pad 201a can be removed, and then the reflector 32a is formed on and connects the second conductivity type semiconductor 13. The reflector 32b is formed in the transparent insulator 14 under the second pad 201b. The reflector 32b has a same shape as the second pad 201b, and the area of the reflector 32b is not greater than the second pad 201b. The reflector 32b connects the current spreading layer 17. In another embodiment, a part of the current spreading layer 17 under the second pad 201b is removed, and then the reflector 32b is formed on and connects the second conductivity type semiconductor 13. In another embodiment as shown in FIG. 7, the difference between the structure of this embodiment and that of the third embodiment is the reflectors are not formed.

In the embodiments described above, the first electrode extending layer 24a can be a circle, a stripe shape or a ring shape. However, it will be apparent to those skill in the art that modifications and variations could be made without departing from the spirit and the scope of the presented disclosure. The second electrode extending layer 24b can also be a circle, a stripe shape or a ring shape.

A manufacturing method for the light-emitting devices in the aforementioned embodiments is described as following. Firstly, the first conductivity type semiconductor 11, the active layer 12 and the second conductivity type semiconductor 13 are sequentially formed on the substrate 10 by an epitaxy process. Next, a portion of the second conductivity type semiconductor 13, the active layer 12 and the first conductivity type semiconductor 11 are removed by etching the second conductivity type semiconductor 13 downward so as to expose a part of the first conductivity type semiconductor 11, and to form the exposed region 30. The current spreading layer 17 is optionally formed on the second conductivity type semiconductor 13 by evaporation or sputtering. In this step, the current spreading layer 17 which is disposed in the exposed region 30 is removed and the remained current spreading layer 17 is formed on the second conductivity type semiconductor 13. The first electrode extending layer 24a is formed on the first conductivity type semiconductor 11 in the exposed region 30, and at the same time, the second electrode extending layer 24b is formed on the current spreading layer 17 with predefined shape and location. The reflectors 32a and 32b can also be optionally formed on the second conductivity type semiconductor 13 or the current spreading layer 17 before forming the first and the second electrode extending layers 24a and 24b. In another embodiment, the reflectors 32a and 32b can be formed on the current spreading layer 17 simultaneously.

Next, the transparent insulator 14 is formed on the current spreading layer 17 and fills in the exposed region 30. The first and the second through holes 40a and 40b are formed by etching from a surface of the transparent insulator 14 opposite the second conductivity type semiconductor 13 at predefined locations. The first through hole 40a exposes the first electrode extending layer 24a to the outside, and the second through hole 40b exposes the second electrode extending layer 24b to the outside. The first and the second conductive channel layers 60a and 60b are respectively formed in the first and the second through holes 40a and 40b by evaporating, sputtering, electroless plating or electroplating. The first conductive channel layer 60a connects to the first electrode extending layer 24a, and the second conductive channel layers 60b connects to the second electrode extending layer 24b. Then, the first and the second electrodes 20a and 20b are formed on the transparent insulator 14 to electrically connect to the first and the second conductive channel layers 60a and 60b, respectively.

Figure 8A:
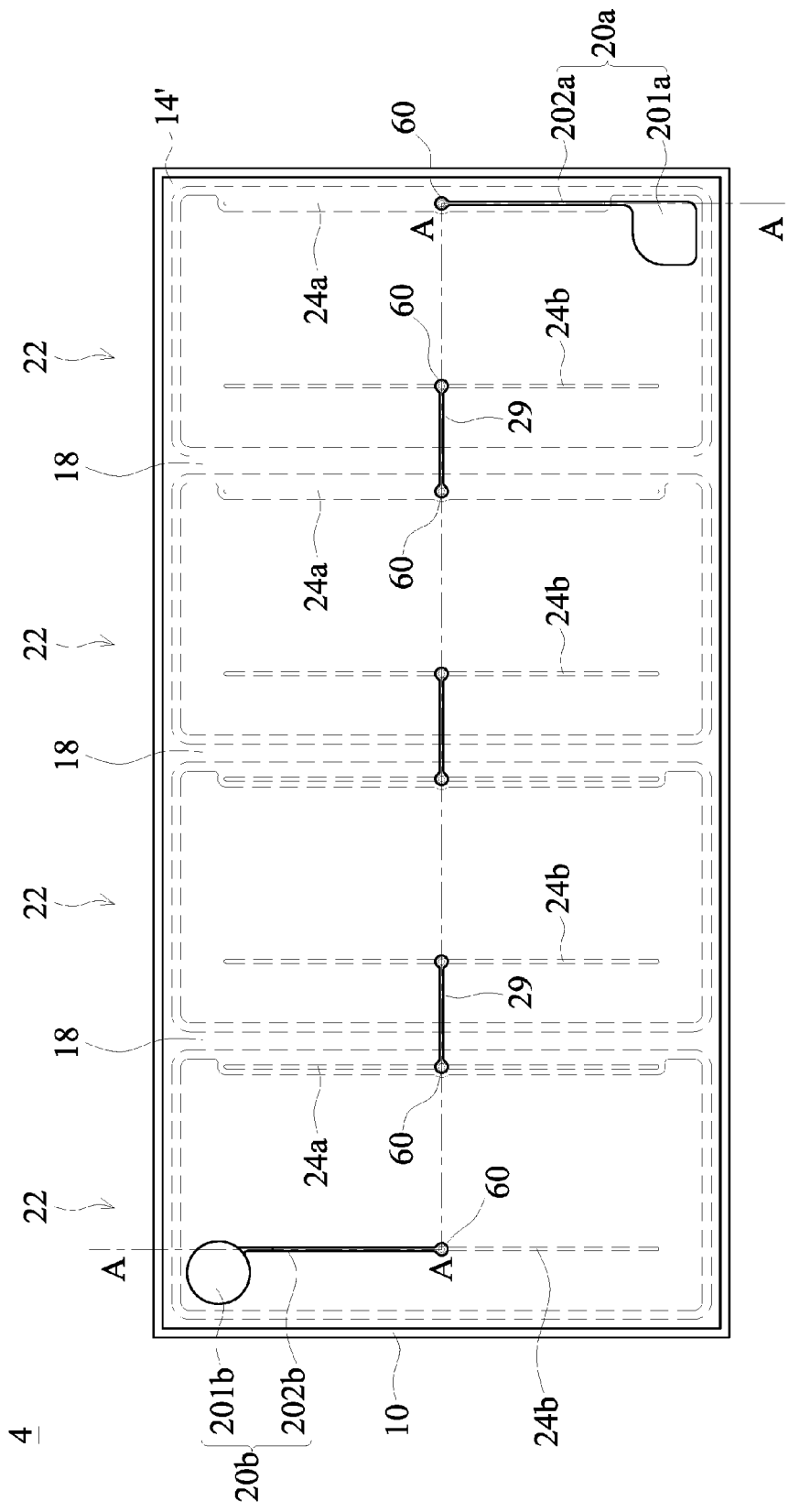
FIGS. 8A-8E show a light-emitting device 4 in accordance with a forth embodiment of present disclosure.
Figure 8B:
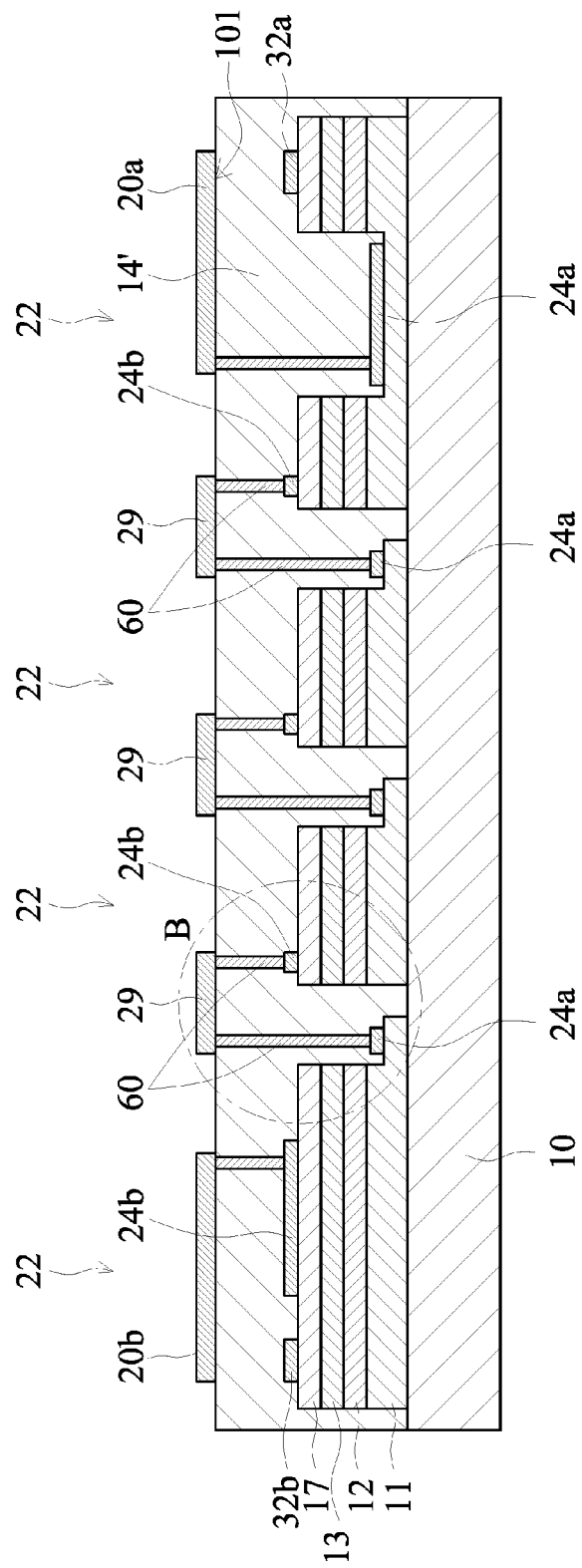

FIGS. 8A-8E show a light-emitting device 4 in accordance with the forth embodiment of the present disclosure. FIG. 8A is a top view, and FIG. 8B is a cross-sectional view taken along A-A line in FIG. 8A. The light-emitting device 4 comprises a substrate 10, and four light-emitting units 22 disposed on the substrate 10. Trenches 18 are formed between each two adjacent light-emitting units 22 and separate the light-emitting units 22. A first conductivity type semiconductor 11, an active layer 12 and a second conductivity type semiconductor 13 are sequentially formed on the substrate 10 by epitaxy. Parts of the first conductivity type semiconductor 11, the active layer 12 and the second conductivity type semiconductor 13 are etched away to expose the substrate 10 and form the trenches 18, and then four light-emitting units 22 separately arranged on the substrate 10 are formed. Each light-emitting unit 22 has the first conductivity type semiconductor 11 (e.g. an n-type semiconductor), the active layer 12, the second conductivity type semiconductor 13 (e.g. a p-type semiconductor). The light-emitting unit 22 can further include a current spreading layer 17 including low resistance and high conductivity on the second conductivity type semiconductor 13. In another embodiment, more tranches 13 can be formed to define and separate more light-emitting units 22.

Parts of the second conductivity type semiconductor 13, the active layer 12 and the first conductivity type semiconductor 11 are etched from a top surface of each light-emitting unit 22 thereby part of the first conductivity type semiconductor 11 is exposed. In each light-emitting unit 22, a first electrode extending layer 24a is formed on the exposed first conductivity type semiconductor 11, and a second electrode extending layer 24b is formed on the current spreading layer 17. Referring to FIG. 8A and FIG. 8D, the first and the second electrode extending layers 24a and 24b have stripe shapes; however, the shapes thereof can be circle, ring or other shapes according to the area or the shape of the light-emitting unit 22.

A transparent insulator 14' simultaneously covers the light-emitting units 22 and further extends to all the trenches 18 and fills in the trenches 18. In this manner, an upper surface 101 of the transparent insulator 14' opposite to the substrate 10 has a consistent level and the difference in heights between the light-emitting units 22 and the trenches 18 can be planarized by the transparent insulator 14'.

A plurality of through holes (not shown) is formed in the transparent insulator 14' by etching the upper surface 101 of the transparent insulator 14' downward corresponding to the locations of the first and the second electrode extending layers 24a and 24b. Conductive materials are filled in the through holes to form a plurality of conductive channel layers 60. In this embodiment, bottoms of a part of the conductive channel layers 60 contact and electrically connect the first electrode extending layer 24a; bottoms of another part of the conductive channel layers 60 contact and electrically connect the second electrode extending layer 24b.

A first electrode 20a, a second electrode 20b and a plurality of connecting layers 29 are formed on the transparent insulator 14'. Referring to FIG. 8A, the first electrode 20b is formed on one edge of the transparent insulator 14', and the second electrode 20b is formed on another edge of the transparent insulator 14' from a top view. The two edges are opposite. However, the locations of the first and the second electrodes can be modified according to various designs.

The first electrode 20a comprises a first pad 201a and a first extending part 202a extending from the first pad 201a. The first extending part 202a electrically connects to the first electrode extending layer 24a of one light-emitting unit 22 thereunder by the conductive channel layer 60. The second electrode 20b also comprises a second pad 201b and a second extending part 202b extending from the second pad 201b. The second extending part 202b electrically connects to the second electrode extending layer 24b of another light-emitting unit 22 thereunder by the conductive channel layer 60. In another embodiment, the first and the second electrodes 20a and 20b can be devoid of the extending part. The first and the second electrodes 20a and 20b can only include the first pad 201a and the second pad 201b without first extending part 202a and the second extending part 202b, and directly connect to the first and the second electrode extending layers 24a and 24b by the conductive channel layers 60. The electrode can directly connect to the electrode extending layer via the conductive channel layer as long as modifying the location or the shape of the electrode.

The electrode extending layers can be defined with different conductivity types by different conductivity-type semiconductor which the electrode extending layers are located on (i.e. the first and the second electrode extending layers 24a and 24b connecting the first conductivity type semiconductor 11 and the second conductivity type semiconductor 13 respectively) on each light-emitting unit electrically connect to the electrical connecting layer 29 by the conductive channel layers 60 formed on the respective electrode extending layers. As a result, the four light-emitting units 22 electrically connect with each other. In this embodiment, the first and the second electrode extending layers 24a and 24b of two adjacent light-emitting units 22 electrically connect to the electrical connecting layer 29 by two conductive channel layers 60, and the four light-emitting units 22 electrically connect in series. The equivalent circuit is shown as FIG. 8E.

Figure 8C:
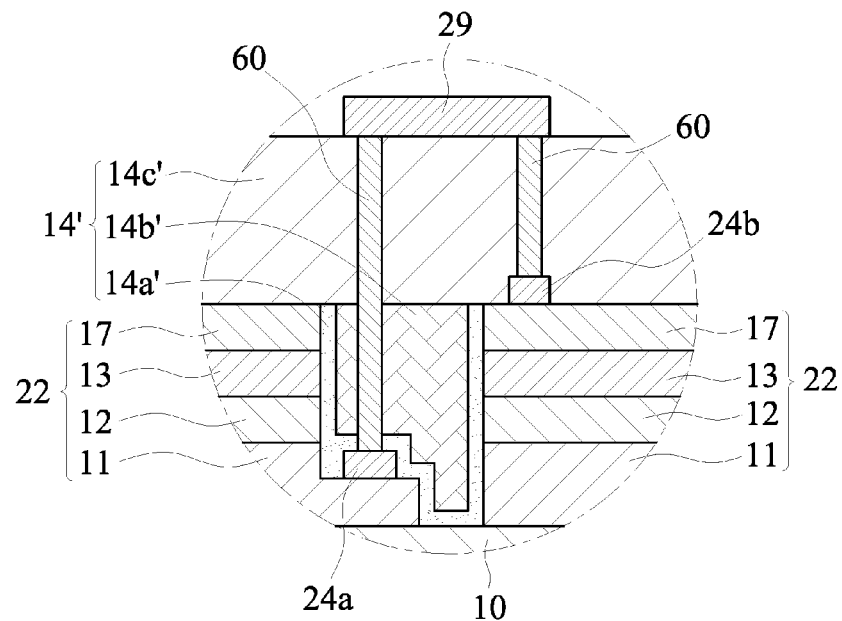
Figure 8D:
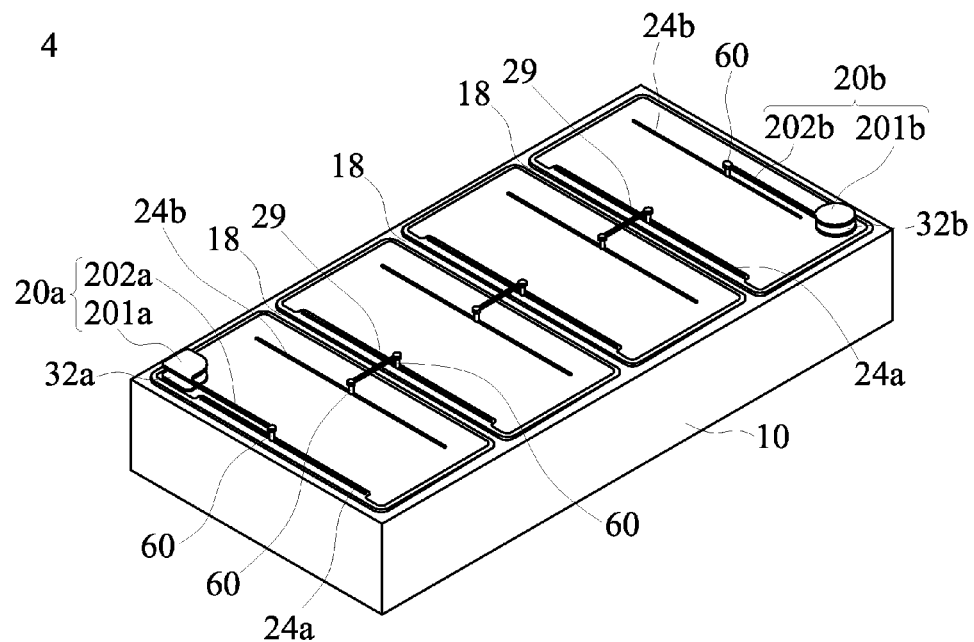

FIG. 8C is an enlarged view of region B in FIG. 8B. The transparent insulator 14' includes three layers including a first transparent insulator 14a' covering the sidewalls of adjacent light-emitting units 22; a second transparent insulator 14b' covering the first transparent insulator 14a' and filling in the trenches 18; and a third transparent insulator 14c' simultaneously covering the first transparent insulator 14a', the second transparent insulator 14b' and surfaces of the plurality of light-emitting units 22. The materials of the first, the second and the third transparent insulators 14a', 14b' and 14c' include but are not limited to $Al_2O_3$, $SiO_2$, AlN, $SiN_x$, $TiO_2$, $Ta_2O_5$ or combination thereof. The thickness of the first transparent insulator 14a' is 0.1 μm-0.2 μm. The second transparent insulator 14b' can be spin-on-glass (SOG). The thickness of the third transparent insulator 14c' is 1 μm-2 μm; however, the thickness of the third transparent insulator 14c' is not limited to this range, it can also be increased to more than 10 μm. The thicker third transparent insulator 14c' enlarges the distance between the first or the second electrode 20a, 20b and the active layer 12 so as to reduce an sheltering angle between the active layer 12 and the electrodes 20a and 20b. Thus, light extracted from the side surface of the third transparent insulator 14c' is increased, and the light efficiency of the light-emitting device can be improved.

FIG. 8D is a perspective view in accordance with the forth embodiment. In order to specifically show the first and the second electrode extending layers 24a and 24b, the transparent insulators 14' in all the perspective views of following embodiments are hided. Besides, the structures and the layers which are formed under or in the transparent insulator 14' in FIG. 8A are drawn as dash-lines. Referring to FIG. 8D, reflectors 32a and 32b are disposed on the light-emitting units 22 under the first and the second electrodes 20a and 20b, i.e. on the current spreading layer 17. The hided transparent insulator 14' covering the reflectors is between the first electrode 20a (the second electrode 20b) and the reflector 32a (32b). The area of the reflector 32a is substantially same as the area of the first pad 201a. The area of the reflector 32b is substantially same as the area of the second pad 201b. In this manner, light sheltered by the electrodes can be reduced, and more light can be reflected to outside so as to improve the brightness.

Figure 8E:
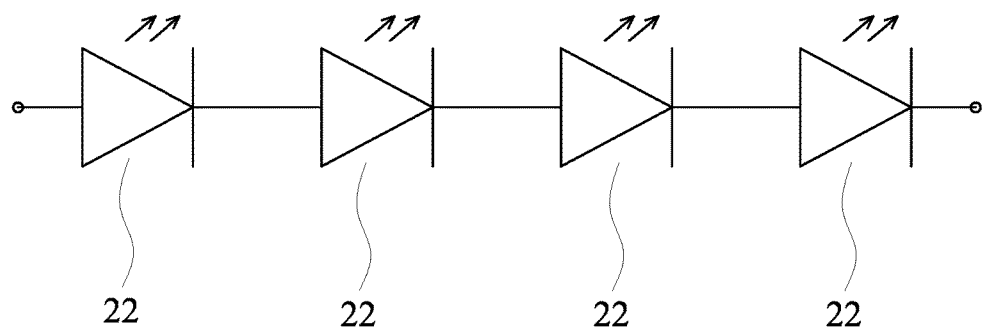
Figure 9A:
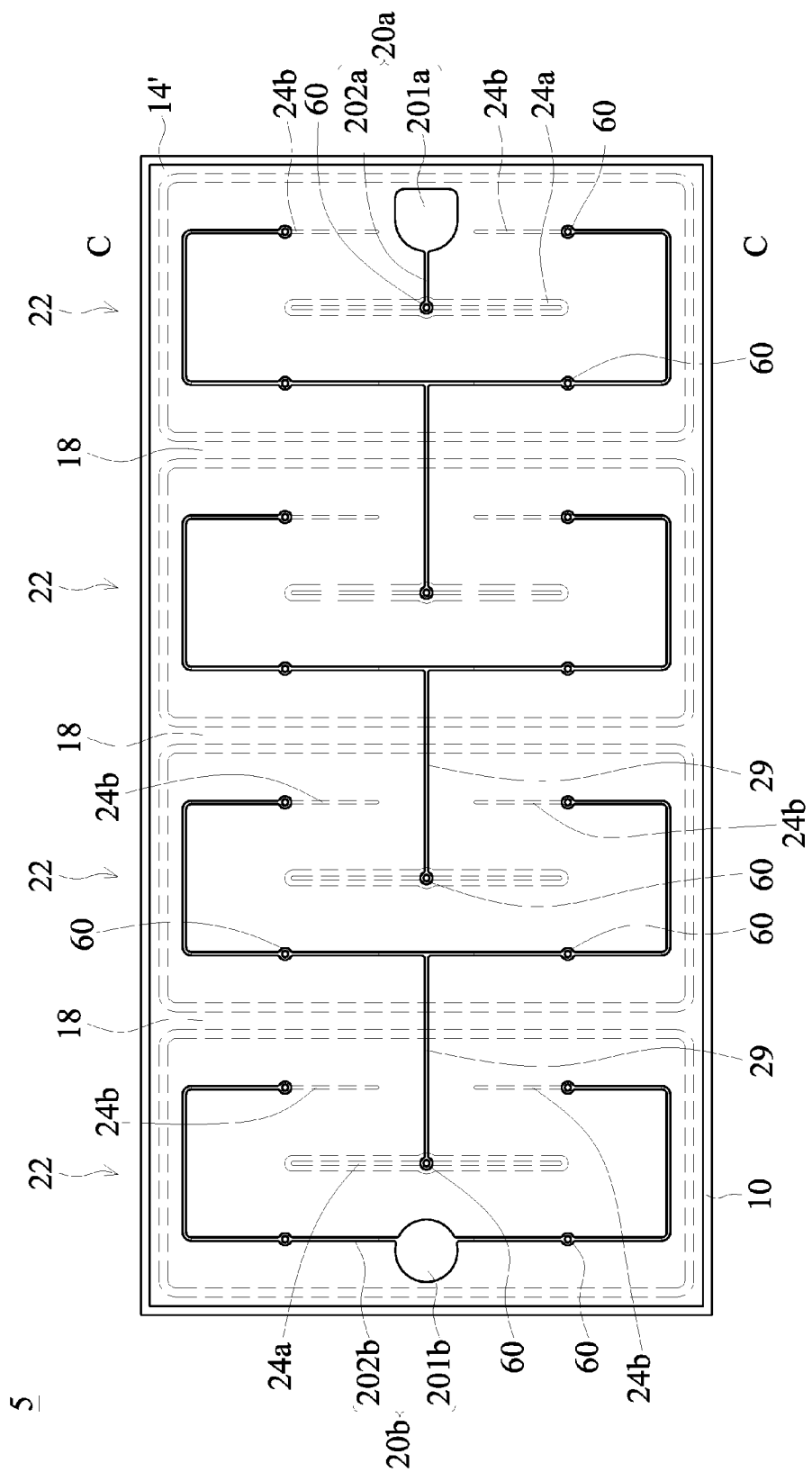
FIGS. 9A-9C show a light-emitting device 5 in accordance with a fifth embodiment of present disclosure.
Figure 9B:
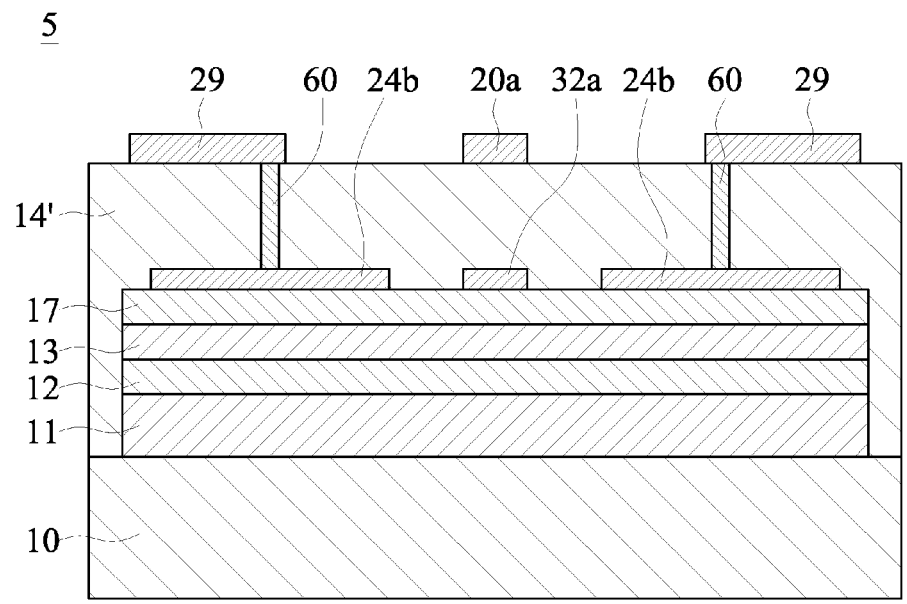
Figure 9C:
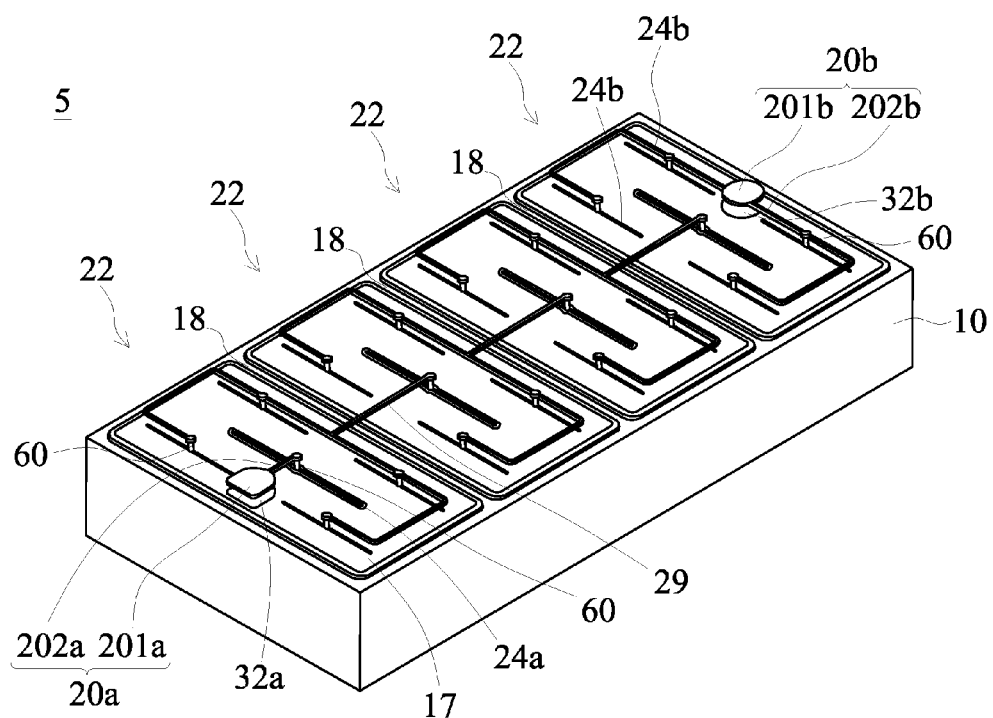

FIGS. 9A-9C show a light-emitting device 5 in accordance with the fifth embodiment. The structures and the layers which are formed under or in the transparent insulator 14' in FIG. 9A are drawn as dash-lines The difference between this embodiment and the forth embodiment is that the first electrode 20a is formed on the middle of one edge of the transparent insulator 14'; the second electrode 20b is formed on the middle of another edge of the transparent insulator 14'. A part of the first conductivity type semiconductor 11 is exposed at the middle of upper surface of each light-emitting unit 22 from a top view. A first electrode extending layer 24a is formed on the exposed first conductivity type semiconductor 11. Four second electrode extending layers 24b are formed on the current spreading layer 17 surrounding the first electrode extending layer 24a. The four second electrode extending layers 24b electrically connect to the electrical connecting layer 29 on the transparent insulator 14' by the conductive channel layers 60. The first extending part 202a and the first electrode extending layer 24a on the light-emitting unit 22 beneath the first electrode 20a are electrically connected with each other by the conductive channel layer 60. The second extending part 202b and the four second electrode extending layers 24b on the light-emitting unit 22 beneath the second electrode 20b are electrically connected with each other by the conductive channel layers 60. The first electrode extending layer 24a of other light-emitting units 22 and the four second electrode extending layers 24b on the adjacent light-emitting units 22 electrically connect t to the electrical connecting layer 29 by the conductive channel layers 60. Four light-emitting units 22 electrically connect in series, and the equivalent circuit is also shown in FIG. 8E. In this embodiment, since four second electrode extending layers 24b are formed on each light-emitting unit 22, current spreading is more uniform in the light-emitting units 22.

Figure 10A:
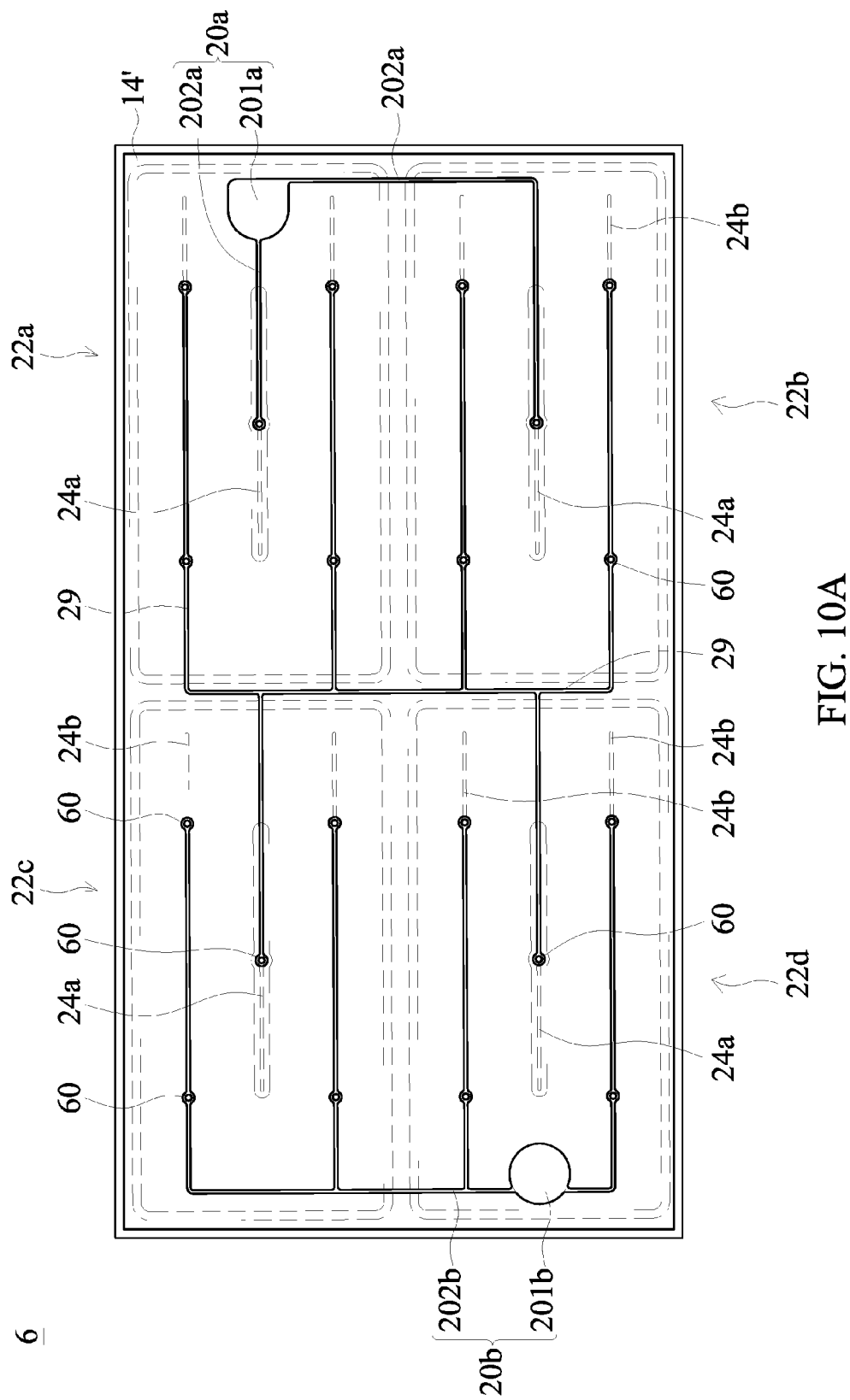
FIGS. 10A-10C show a light-emitting device 6 in accordance with a sixth embodiment of present disclosure.
Figure 10B:
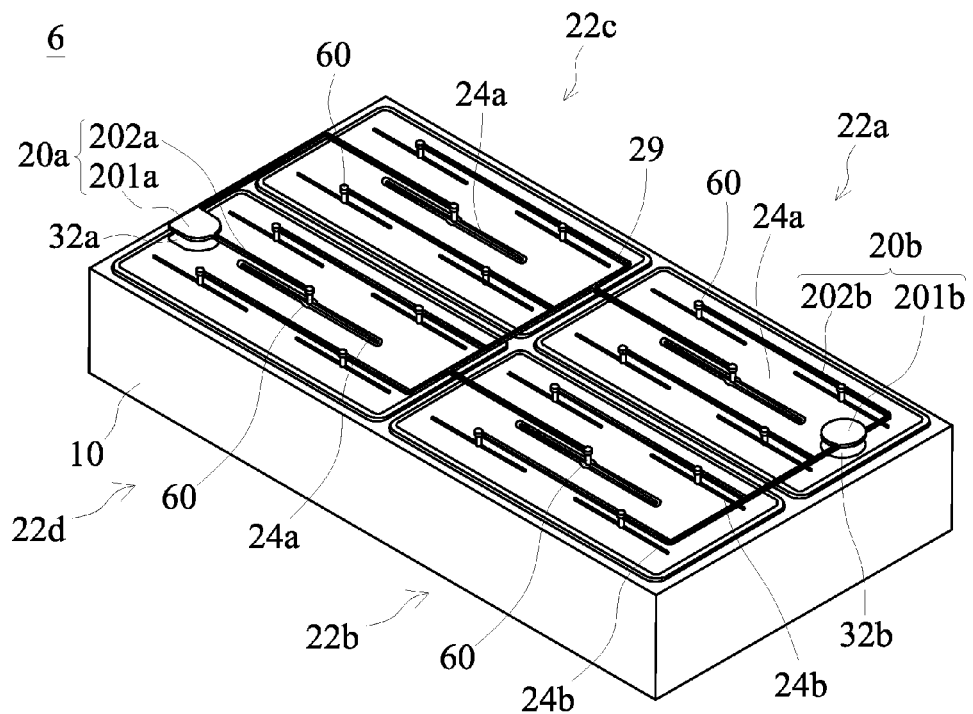
Figure 10C:
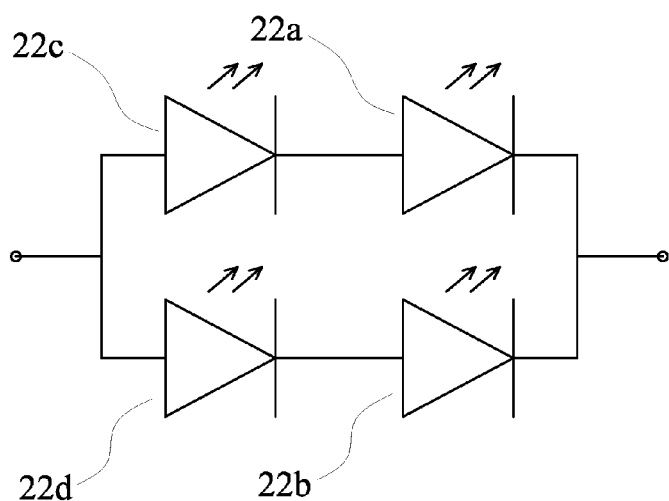

FIGS. 10A-10C show a light-emitting device 6 in accordance with the sixth embodiment. The structures and the layers which are formed under or in the transparent insulator 14' in FIG. 10A are drawn as dash-lines. The difference between this embodiment and the above embodiments is that four light-emitting units 22a-22d are arranged on the upper surface of the substrate 10 in a 2×2 two-dimensional array, and the four light-emitting units 22a-22d form a series-parallel electrical connection. The first extending part 202a simultaneously contacts and electrically connects to electrode extending layers with the same conductivity type (i.e. the first electrode extending layers 24a) of two light-emitting units 22c and 22d by the conductive channel layers 60. The second extending part 202b simultaneously contacts and electrically connects to electrode extending layers with the same conductivity type (i.e. the four second electrode extending layers 24b) of two light-emitting units 22a and 22b by the conductive channel layers 60. Two of the four light-emitting units 22 (i.e. 22a and 22c; 22b and 22d) electrically connect in a first and a second series, and then the first and the second series electrically connect in parallel. The equivalent circuit is shown as FIG. 10C.

Figure 11A:
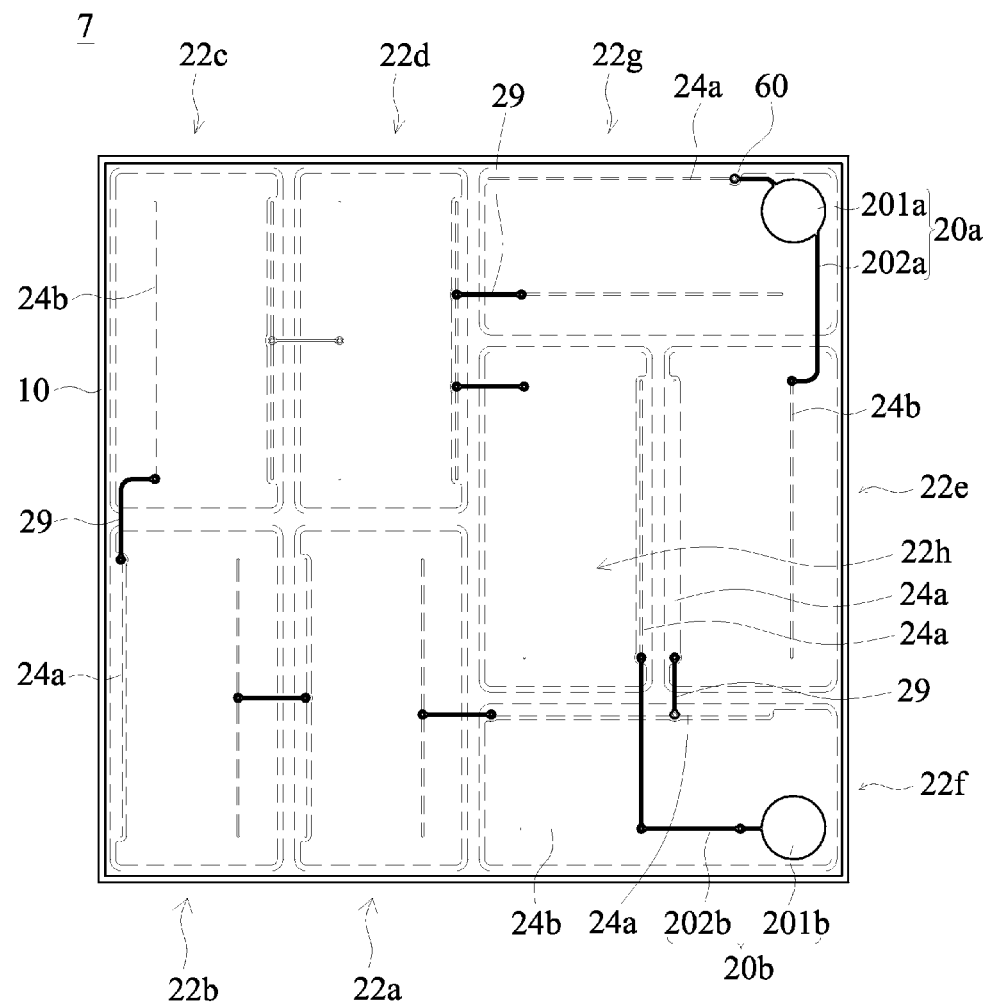
FIGS. 11A-11C show a light-emitting device 7 in accordance with a seventh embodiment of present disclosure.
Figure 11B:
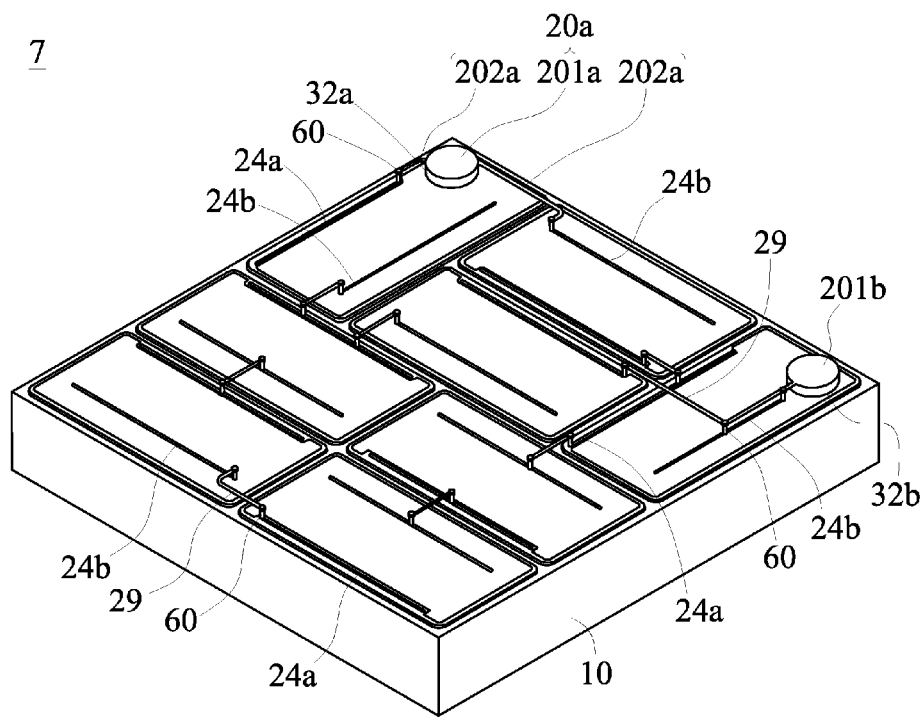
Figure 11C:
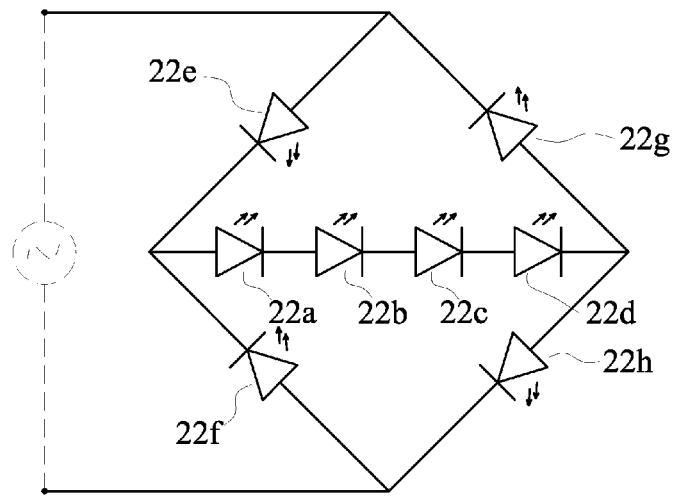

FIGS. 11A-11C show a light-emitting device 7 in accordance with the seventh embodiment. The structures and the layers which are formed under or in the transparent insulator 14' in FIG. 11A are drawn as dash-lines. The difference between this embodiment and the above embodiment is that eight light-emitting units 22a-22h are arranged on the substrate 10. The light-emitting units 22a-22h are separated from each other by the trenches 18. The eight light-emitting units 22a-22h electrically connect to form an AC (alternating current) LED. The first extending part 202a electrically connects to a first electrode extending layer 24a of one light-emitting unit 22 and to a second electrode extending layer 24b of another light-emitting unit 22 simultaneously by the conductive channel layers 60. The second extending part 202b electrically connects to a first electrode extending layer 24a of one light-emitting unit 22 and to a second electrode extending layer 24b of another light-emitting unit 22 simultaneously by the conductive channel layers 60. That is, the extending parts of the first and the second electrodes can simultaneously and electrically connects to electrode extending layers with different conductivity types of different light-emitting units. The equivalent circuit is shown as FIG. 11C. The eight light-emitting units 22a-22h form a bridge rectifier circuit. Four light-emitting units 22a-22d form the middle arm of the bridge, and each light-emitting unit 22e-22h is respectively arranged in the four surrounding arms. Two terminals of the bridge rectifier circuit connect to an AC power. When applying the AC power, six light-emitting units 22e, 22a-22d and 22h emit light during positive half-cycles, and six light-emitting units 22f, 22a-22d and 22g emit light during negative half-cycles. The light-emitting device with the structure as described in the embodiment can be directly connected to and driven by an AC power without converting AC current into DC current.

From the forth to the seventh embodiments described above, a plurality of light-emitting units 22 can be electrically connected with each other via the first and the second electrode extending layers 24a/24b, the conductive channel layers 60, electrical connecting layers 29, the first and the second electrodes 20a/20b and the transparent insulator 14'. Therefore, a complex electrical connection can be easily realized. Besides, the number, the shape and the location of the first and the second electrical extending layers 24a/24b can be flexibly arranged to spread current in each light-emitting unit 22. The current injection points of each light-emitting unit 22 can be selected thereby to achieve a uniform current spreading. The brightness and the lifetime of the light-emitting units can be improved.

A manufacturing method for the light-emitting devices in the aforementioned embodiments is described as following. In a first step, the first conductivity type semiconductor 11, the active layer 12 and the second conductivity type semiconductor 13 are sequentially formed on the substrate 10 by an epitaxy process. The first conductivity type semiconductor 11, the active layer 12 and the second conductivity type semiconductor 13 compose a semiconductor stack. In a second step, areas of a plurality of light-emitting units 22 are defined. A portion of the semiconductor stack is etched from a top surface thereof to the substrate 10 to form trenches 18. The plurality of light-emitting units 22 are separated and defined by the trenches 18. In a third step, a contact area of the first conductivity type semiconductor in each light-emitting unit 22 is defined. A portion of the second conductivity type semiconductor 13, the active layer 12 and the first conductivity type semiconductor 11 are removed by etching the second conductivity type semiconductor 13 downward so as to expose parts of the first conductivity type semiconductor 11. The current spreading layer 17 is formed on the second conductivity type semiconductor 13 of each light-emitting unit 22. In a forth step, a plurality of the second electrode extending layers 24b is formed on the current spreading layer 17 of each light-emitting unit 22 and a plurality of the first electrode extending layers 24a is formed on the exposed first conductivity type semiconductor 11 of each light-emitting unit 22 by evaporating, sputtering or electroplating.

In a fifth step, the transparent insulator 14' is formed on and covers all the light-emitting units 22 by physical coating or CVD. In a sixth step, the plurality of through holes is defined on the upper surface of the transparent insulator 14' and the defined transparent insulator 14' are etched by dry etching or wet etching to form the plurality of through holes. In a seventh step, metal layer is formed in each through hole to form the plurality of conductive channel layers 60 by electroless plating, evaporating or sputtering. The conductive channel layers 60 can be as high as the upper surface of the transparent insulator 14' or be slightly higher than the upper surface of the transparent insulator 14'. The first electrode extending layer 24a of each light-emitting unit 22 connects to the upper surface of the transparent insulator 14' by at least one conductive channel layer 60; the second electrode extending layer 24b of each light-emitting unit 22 connects to the upper surface of the transparent insulator 14' by at least one conductive channel layer 60.

In an eighth step, the first electrode 20a, the second electrode 20b and the plurality of electrical connecting layers 29 are formed on defined locations of the upper surface of the transparent insulator 14' by electroless plating, evaporating or sputtering. The first electrode 20a connects to the first electrode extending layer 24a of at least one light-emitting unit 22 or simultaneously connects to the first and the second electrode extending layers 24a and 24b of different light-emitting units 22. The second electrode 20b connects to the second electrode extending layer 24b of at least one light-emitting unit 22 or simultaneously connects to the first and the second electrode extending layers 24a and 24b of different light-emitting units 22. The electrode extending layers connecting with the same conductivity type semiconductors or different conductivity type semiconductors of different light-emitting units 22 connect to the upper surface of the transparent insulator 14' by the conductive channel layers 60, and form electrical connections by the electrical connecting layers 29. As a result, the plurality of light-emitting units 22 electrically connects with each other to form various electrical networks.

In another embodiment, the transparent insulator 14' in the fifth step can have a three-layered structure and be formed in three processes. First, the first transparent insulator 14a' is formed on side surfaces of adjacent light emitting units 22 by physical coating or CVD. The first transparent insulator 14a' can be $SiO_2$ and the thickness thereof is 0.1 μm-0.2 μm. Next, the second transparent insulator 14b' is formed in the trenches 18 of adjacent light-emitting units 22 by physical coating or CVD, and a top surface of the second transparent insulator 14b' is planarized. The second transparent insulator 14b' can be spin-on glass (SOG) so that the second transparent insulator 14b' has better coverage in the trenches 18, and the isolation between adjacent light-emitting units 22 can be secured Finally, a third transparent insulator 14c' is formed on the first transparent insulator 14a', the second transparent insulator 14b' and the plurality of light-emitting units 22 by physical coating or CVD, and a top surface of the third transparent insulator 14c' is planarized. The material of the third transparent insulator 14c' comprises but is not limited to $Al_2O_3$, $SiO_2$, AlN, $SiN_x$, $TiO_2$, $Ta_2O_5$ or combination thereof.

Figure 12A:
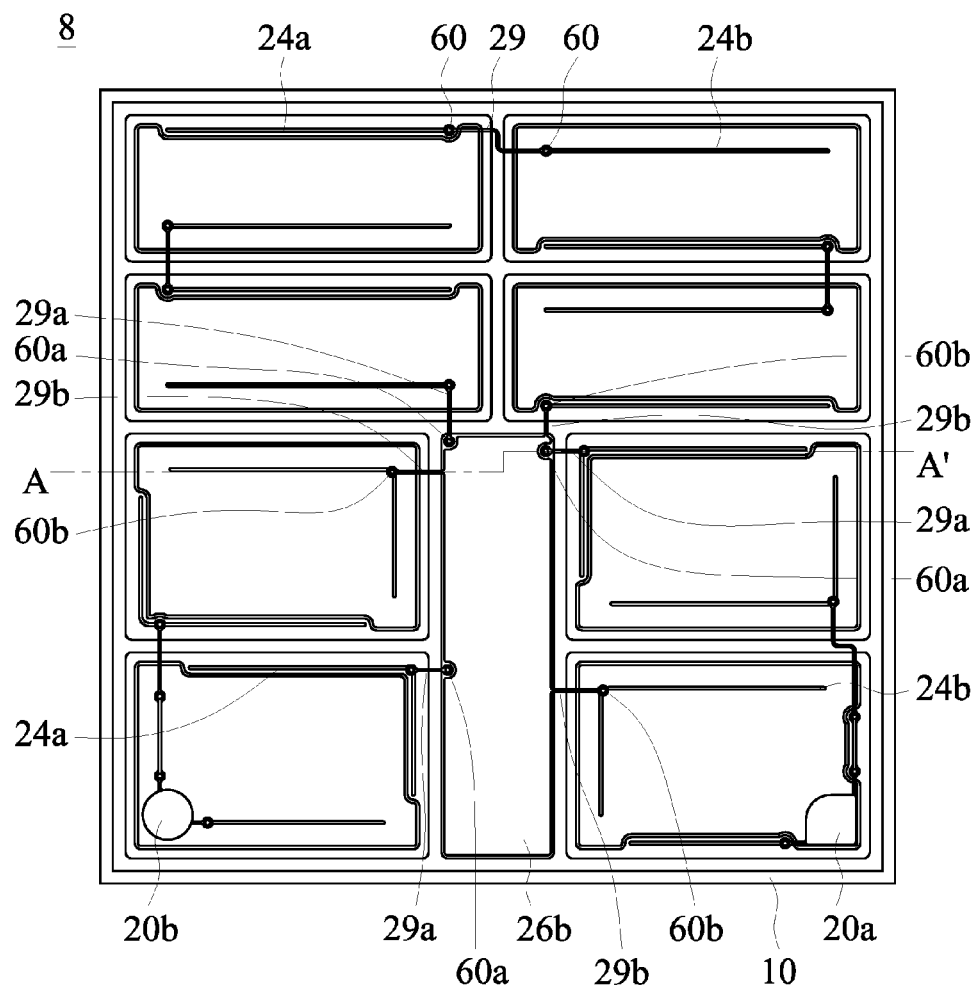
FIGS. 12A-12E show a light-emitting device 8 in accordance with a eighth embodiment of present disclosure.
Figure 12B:
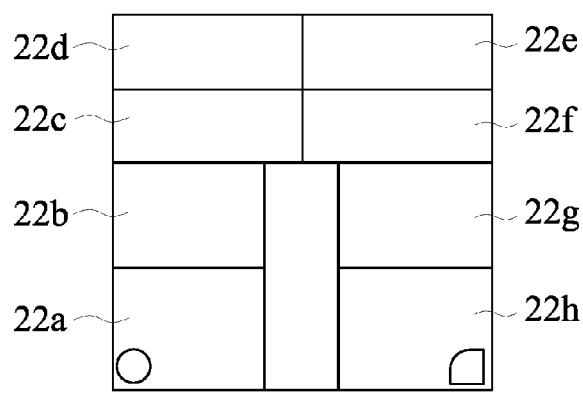
Figure 12C:
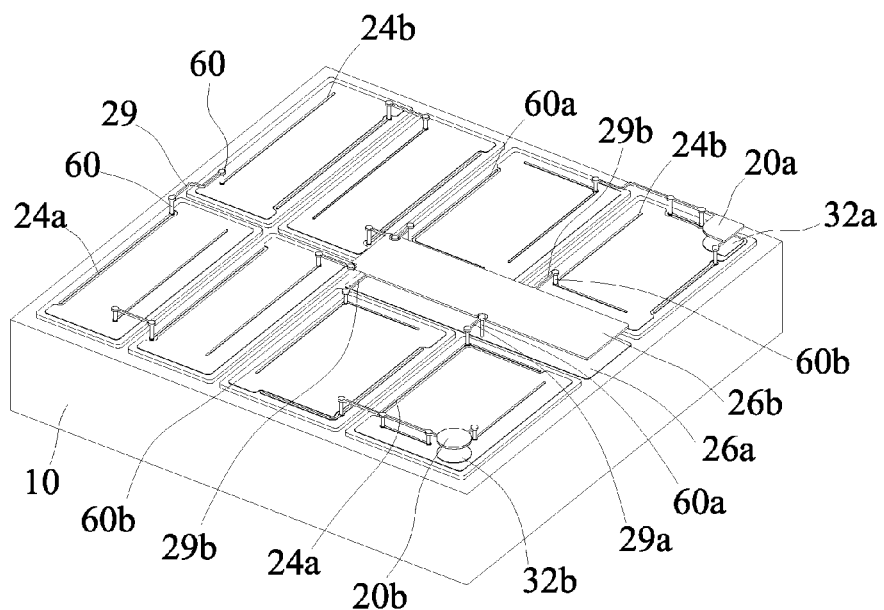
Figure 12D:
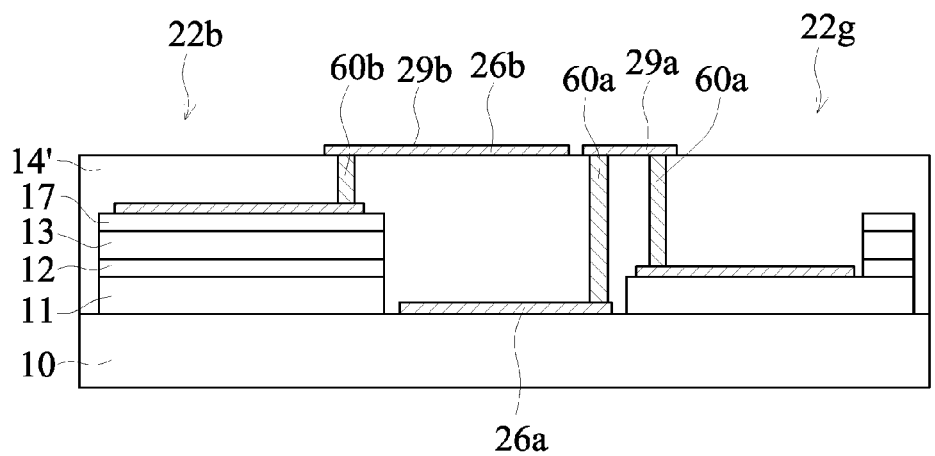

FIGS. 12A-12E show a light-emitting device 8 in accordance with the eighth embodiment. The light-emitting device 8 is an AC LED having a similar cross-sectional structure as the light-emitting device 7. FIG. 12A shows a top view of the light-emitting device 8. FIG. 12B shows a corresponding arrangement of a plurality of light emitting units 22a-22h in FIG. 12A. FIG. 12C is a perspective view and FIG. 12D is a cross-sectional view along the A-A' line of FIG. 12A. In order to specifically show the structure of the light-emitting device 8, a transparent insulator 14' in FIG. 12B is hided.

Figure 12E:
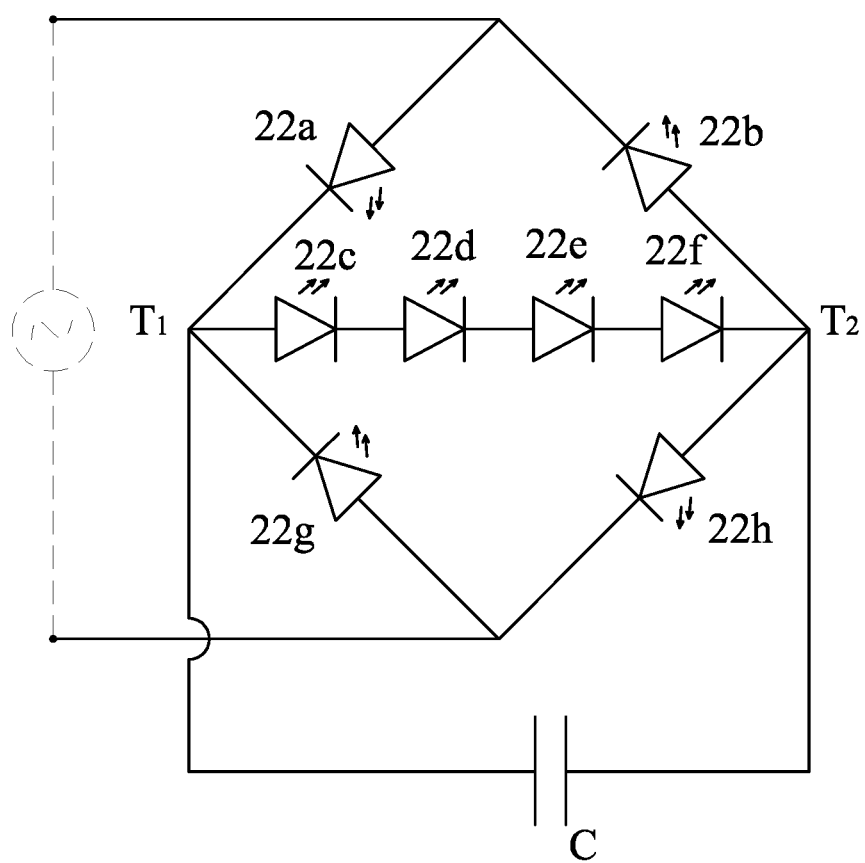

As shown in FIGS. 12A-12D, the difference between the light-emitting device 8 and the light-emitting device 7 is that, the light-emitting device 8 further comprises a first metal layer 26a formed on the substrate 10 and a second metal layer 26b formed on the transparent insulator 14' opposite to the first metal layer 26a. The first and the second metal layers 26a and 26b overlap and are parallel with each other. A plurality of conductive channel layers 60a passes through the transparent insulator 14' and contacts the first metal layer 26a to connect the first metal layer 26a and the corresponding electrical connecting layers 29a. Then, the corresponding electrical connecting layers 29a connect to the first electrode extending layer 24a or the second electrode extending layer 24b of the adjacent light-emitting units. In this embodiment, the first metal layer 26a connects to the first electrode extending layer 24a of light-emitting unit 22a, the second electrode extending layer 24b of light-emitting unit 22c and the first electrode extending layer 24a of light-emitting unit 22g via the conductive channel layers 60a. Thus, the first metal layer 26a electrically connects to the light-emitting units 22a, 22c and 22g. The electrical connecting layers 29b extend from the second metal layer 26b and contact the conductive channel layers 60b. The electrical connecting layers 29b connect to the first electrode extending layer 24a or the second electrode extending layer 24b of the adjacent light-emitting units. In this embodiment, the second metal layer 26b connects to the second electrode extending layer 24b of light-emitting unit 22b, the first electrode extending layer 24a of light-emitting unit 22f and the second electrode extending layer 24b of light-emitting unit 22h via the conductive channel layers 60b. Thus, the second metal layer 26b electrically connects to the light-emitting units 22b, 22f and 22h Similarly, the light-emitting units 22a-22h electrically connect with each other via the conductive channel layers 60 and the electrical connecting layers 29. FIG. 12E shows the equivalent circuit of the light-emitting device 8.

As shown in FIG. 12E, since the transparent insulator 14' is sandwiched between the first and the second metal layers 26a and 26b, capacitance C exists between terminals T1 and T2 and electrically connects to the light-emitting units 22c-22f in parallel, When AC voltage inputs into the light-emitting device 8, the capacitance C acts as a filter. Therefore, the voltage after AC/DC converting can be stabilized so that flickers in the light-emitting device 8 can be prevented and brightness can be more uniform. The capacitance C is calculated as the equation: $C = \in_r \in_0 S/d$; wherein $\in_r$ is the relative static permittivity which is also called the dielectric constant of the material between the first and the second metal layers 26a and 26b; the physical constant $\in_0$ is the vacuum permittivity or permittivity of free space ($\epsilon_0 \approx 8.854 \times 10^{-12}$ F·m$^{-1}$); S is the area of overlap of the first and the second metal layers 26a and 26b, in square meters; d is the separation between the first and the second metal layers 26a and 26b, in meters. Based on the equation, the required capacitance value can be obtained by selecting the overlap area of the two metal layers 26a and 26b, the material and the thickness of the transparent insulator 14' between the two metal layers 26a and 26b.

The first metal layer 26a and the first and the second electrode extending layers 24a and 24b can be formed in a same process. The first metal layer 26a can comprise the same material as the electrode extending layers. The second metal layer 26b and the electrical connecting layers 29a, 29b and 29 can be formed in a same process. The second metal layer 26b can comprise the same material as the electrical connecting layers 29a, 29b and 29. In another embodiment, the first metal layer 26a and the electrode extending layers 24a and 24b can be formed in different process and have different materials. The second metal layer 26b and the electrical connecting layers 29a, 29b and 29 can be formed in different process and have different materials.

According to the embodiments described above, the transparent insulator 14' is formed on the light-emitting units 22, and the plurality of conductive channel layers 60 are formed in the transparent insulator 14'. The first and the second electrode 20a and 20b and the electrical connecting layers 29 are formed on the upper surface of the transparent insulator 14'; the first and the second electrode extending layers 24a and 24b are respectively formed on the first and the second conductivity type semiconductors 11 and 13 of each light-emitting unit 22; electrode extending layers with the same or different conductivity types of different light-emitting units connect to the electrical connecting layers 29 by the conductive channel layers. In this manner, a three-dimensional electrical connection structure is formed. The electrical connection between each light-emitting unit 22 can be more flexible. A complex electrical connection can be easily realized. The isolation between adjacent light-emitting units 22 can be secured. Beside, since the electrical connection structure is three-dimensional, the number, the shape and the location of the first and the second electrical extending layers 24a and 24b can be flexibly arranged. The current injection points of each light-emitting unit 22 can be selected thereby to achieve a uniform current spreading. Brightness and lifetime of the light-emitting units 22 are improved. Thus, reliability of the light-emitting device is also improved.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a substrate;
   a first light-emitting unit formed on the substrate, comprising:
      a first conductivity type semiconductor;
      a second conductivity type semiconductor;
      an active layer formed between the first and the second conductivity type semiconductors; and
      an exposed region formed in the first light-emitting unit, exposing the first conductivity type semiconductor;
   a first electrode extending layer formed on the first conductivity type semiconductor in the exposed region;
   a second electrode extending layer formed on the second conductivity type semiconductor;
   a transparent insulator, formed on the first light-emitting unit and filled in the exposed region;
   a first electrode formed on the transparent insulator, comprising a first pad and a first extending part extending from the first pad;
   a plurality of conductive channel layers formed in the transparent insulator;
   wherein one of the plurality of conductive channel layers connects the first extending part and one of the first and the second electrode extending layers;
   wherein the first pad does not overlap the one of the first and the second electrode extending layers;
   a second light-emitting unit or more light-emitting units separately formed on the substrate, wherein the first light-emitting unit and the second light-emitting unit or more light-emitting units compose a plurality of light-emitting units, and wherein each of the plurality of light-emitting units comprises the first conductivity type semiconductor, the second conductivity type semiconductor, the active layer and the exposed region;
   a plurality of the first electrode extending layers and a plurality of the second electrode extending layers formed on the plurality of light-emitting units;
   a second electrode;
   a trench formed between any two adjacent light-emitting units; and
   an electrical connecting layer;
   wherein the first electrode is formed on one of the plurality of light-emitting units and the second electrode is formed on another one of the plurality of light-emitting units;
   wherein the transparent insulator is formed on the plurality of light-emitting units;
   wherein the electrical connecting layer is formed on the transparent insulator, and connects the conductive channel layers on different light-emitting units to electrically connect the plurality of light-emitting units; and
   wherein the transparent insulator comprises a top surface opposite to the substrate, and the first electrode, the second electrode and the electrical connecting layer are formed on and contact the top surface.

2. The light-emitting device of claim 1, wherein the transparent insulator is filled in the trench and simultaneously covers the plurality of light-emitting units to form a planar upper surface.

3. The light-emitting device of claim 2, wherein a shortest distance between the planar upper surface and the light-emitting units is more than 10μm.

4. The light-emitting device of claim 1, wherein the first and the second electrode extending layers have different conductivity types; the first electrode electrically connects the electrode extending layers with the same conductivity type or different conductivity types on different light-emitting units via the conductive channel layers; and the second electrode electrically connects the electrode extending layers with the same conductivity type or different conductivity types on different light-emitting units via the conductive channel layers.

5. The light-emitting device of claim 1, wherein the transparent insulator comprises a multi-layer structure.

6. The light-emitting device of claim 5, wherein the multi-layer structure comprises:
- a first transparent insulator formed on side surfaces of the adjacent light-emitting units;
- a second transparent insulator, formed on the first transparent insulator and filled in the trench; and
- a third transparent insulator, covering the second transparent insulator and the plurality of light-emitting units.

7. The light-emitting device of claim 6, wherein second transparent insulator comprises spin-on-glass (SOG).

8. The light-emitting device of claim 1, wherein a connection of the plurality of light-emitting units comprises a series electrical connection, a parallel electrical connection or a series-parallel electrical connection.

9. The light-emitting device of claim 8, wherein the plurality of light-emitting units forms an AC LED.

10. The light-emitting device of claim 9, further comprising:
- a first metal layer formed on a surface of the substrate on which the plurality of light-emitting units is formed; and
- a second metal layer formed on the transparent insulator, parallel with and overlapping the first metal layer;
- wherein the first metal layer and the second metal layer electrically connect the light-emitting units via the conductive channel layers.

11. The light-emitting device of claim 10, wherein the first metal layer and the second metal layer form a capacitance between the light-emitting units.

* * * * *